United States Patent [19]
Dennison

[11] Patent Number: 5,198,384
[45] Date of Patent: Mar. 30, 1993

[54] PROCESS FOR MANUFACTURING A FERROELECTRIC DYNAMIC/NON-VOLATILE MEMORY ARRAY USING A DISPOSABLE LAYER ABOVE STORAGE-NODE JUNCTION

[75] Inventor: Charles H. Dennison, Boise, Id.

[73] Assignee: Micron Technology, Inc., Boise, Id.

[21] Appl. No.: 700,747

[22] Filed: May 15, 1991

[51] Int. Cl.[5] .................... H01L 21/265; H01L 21/70
[52] U.S. Cl. ........................................ 437/47; 437/48; 437/52
[58] Field of Search ........................ 437/47, 48, 49, 52; 365/145, 146; 357/23.5, 23.6, 51

[56] References Cited
U.S. PATENT DOCUMENTS 5,043,298  8/1991  Yamada et al. ................ 437/47

FOREIGN PATENT DOCUMENTS 0386947  9/1990  European Pat. Off. ......... 437/47
0191450  8/1989  Japan ............................. 437/47
0044754  2/1990  Japan ............................. 437/47
0094556  4/1990  Japan ............................. 365/149

Primary Examiner—Olik Chaudhuri
Assistant Examiner—Loc Q. Trinh

[57] ABSTRACT

A process for manufacturing a ferroelectric memory array of stacked-cell design that can be operated in both dynamic and nonvolatile modes. The process deviates from conventional stacked cell array processing at the storage node plate formation stage. A storage node polysilicon layer is conformally deposited, while being in-situ conductively doped, to a depth greater than that necessary to completely fill inter-wordline gaps (if not already planarized) and inter-bitline gaps (in the case of a buried digit line process flow). The storage-node poly layer is then planarized to a level at which poly still covers the entire array. Next, a barrier layer of a refractory metal (e.g., platinum) or of a refractory metal silicide is created on top of the planarized storage-node poly layer. A disposable polyimide layer, which is deposited on top of the barrier layer, is patterned during the same step in which the storage node contact layer and barrier layer are patterned. A silicon dioxide layer is subsequently created via low-temperature chemical vapor deposition. After the this silicon dioxide layer is planarized, thus exposing the polyimide layer remnants, the latter are removed. Next, a PZT dielectric layer is deposited via either the well-known solution-gelatin technique or sputtering. Finally, a refractory metal or refractory metal silicide cell plate layer is deposited. The memory array is completed using standard processing from this point.

32 Claims, 19 Drawing Sheets

PROCESS FOR MANUFACTURING A FERROELECTRIC DYNAMIC/NON-VOLATILE MEMORY ARRAY USING A DISPOSABLE LAYER ABOVE STORAGE-NODE JUNCTION

FIELD OF THE INVENTION

This invention relates to semiconductor manufacturing process technology and, more specifically, to processes for manufacturing ferroelectric, random access memory arrays which can be used in either a dynamic or non-volatile mode.

BACKGROUND OF THE INVENTION

The use of ferroelectric materials as capacitor dielectrics in dynamic random access memories may prove to be the single most important advancement in the design of such memories in more than a decade. Ferroelectric materials are characterized by ultra-high dielectric constant values (reportedly, as high as $10^4$, vs. 7 for silicon nitride) and by a propensity to undergo spontaneous magnetic polarization in the presence of a sufficiently strong electric field. The polarized state, useful for non-volatile memory applications, is reversible upon the application of an electric field of opposite polarity. Unfortunately, the polarizability of ferroelectric materials is subject to fatigue, which occurs gradually following repeated cycling between the two magnetic states, and is characterized by a shrinking of the hysterisis curve. As a general rule, at some point after some $10^{10}$ bipolar stressing cycles, a ferroelectric material becomes unusable. However, if ferroelectric materials are used as ordinary cell dielectrics within a capacitance-based memory array, and the array is normally utilized in a dynamic mode (i.e., with unipolar stressing of the dielectric without hysteresis cycling), with bipolar stressing of the dielectric being reserved for long-term storage functions (e.g., for machine-off data storage), the fatigue factor becomes totally insignificant.

Of the known ferroelectric materials, one of the most carefully studied in the role of a DRAM dielectric is a material known as lead zirconate titanate ($PbZr_xTi_{1-x}O_3$). Lead zirconate titanate, commonly known as PZT, has a dielectric constant of approximately 577 (vs. 6-7 for silicon nitride), a breakdown voltage of approximately $2 \times 10^6$ V/cm (vs. $7-8 \times 10^6$ for silicon nitride), and a leakage current density of approximately 25 $\mu A/cm^2$ (vs. approximately 10 nanoamps/$cm^2$ for silicon nitride). None of the three values is polarity dependent. As can be seen, the leakage current density of PZT is some 2,500 times higher than that of silicon nitride. Although the leakage current density of PZT films may be nearly halved by adding impurities such as lanthanum and iron which compensate for oxygen and lead vacancies prevalent in the film structure, PZT dielectric layers used in DRAMs must be much thicker than silicon dioxide/silicon nitride/silicon dioxide structures now in use to compensate for the great differences between the two films with regard to leakage current density.

The use of PZT dielectrics in dynamic memory arrays will require many changes in conventional memory manufacturing process flows. For first generation dynamic/non-volatile memories using a PZT dielectric, dielectric thickness will need to be approximately 4,000 Å. This figure is expected to decrease to approximately 2,000 Å for second generation devices. In addition, it will be necessary to construct both top and bottom capacitor electrodes from either metal or a refractory metal silicide to prevent diffusion of lead atoms from the PZT layer into the silicon. Finally, an appropriate cell structure must prevent the high dielectric constant of PZT materials from creating unacceptable levels of cell-to-cell capacitance.

SUMMARY OF THE INVENTION

This invention constitutes a process for fabricating a capacitance-based, memory cell array which utilizes PZT for the cell dielectric. The process flow is ideally suited for solution-gelatin ("SOL-GEL") deposition of PZT, the simplest and potentially most manufacturable method of PZT deposition discovered to date. The process utilizes the deposition of a disposable polyimide layer above the storage-node contact to form a cavity for the thick PZT dielectric layer required. The PZT layer is completely self aligned to a polysilicon storage-node buried contact and requires no additional masking steps.

The process may be incorporated in either a buried digit line process flow that has become the standard for contemporary stacked-cell designs, or in a non-buried digit line process flow used for earlier generations of integrated circuits, which is characterized by digit line formation subsequent to storage-node definition. The process deviates from standard process flows at the onset of storage-node plate formation. After storage-node contact openings are made between wordlines and, in the case of buried digit line process flows, also between digit lines, a storage-node poly layer is conformally deposited, while being in-situ conductively doped, to a depth greater than that necessary to completely fill inter-wordline gaps (if not already planarized) and inter-bitline gaps (in the case of a buried digit line process flow). The storage-node poly layer is then planarized to a level at which poly still covers the entire array. Next, a barrier layer of a refractory metal (e.g., platinum) or of a refractory metal silicide is created on top of the planarized storage-node poly layer. A disposable polymer layer, such as polyimide, is then deposited on top of the barrier layer to a depth that is at least that of the desired thickness of the PZT dielectric layer, which will be deposited later. The disposable polymer layer is then patterned with photoresist, and the polymer layer, the barrier layer, and the storage-node poly layer are all anisotropically etched during a single etch step to create polyimide-covered storage node plates. Low-temperature chemical vapor deposition of a suitable dielectric layer (e.g., silicon dioxide) follows. The dielectric layer is then planarized to at least the level of the upper surface of the disposable polymer layer. Following the removal of the disposable polymer layer, a PZT layer is deposited via either the solution-gelatin technique or sputtering. The PZT layer is then annealed. Finally, a refractory metal or refractory metal silicide cell plate layer is deposited. The memory array is completed using standard processing from this point.

PREFERRED EMBODIMENT OF THE INVENTION

Figure 1:
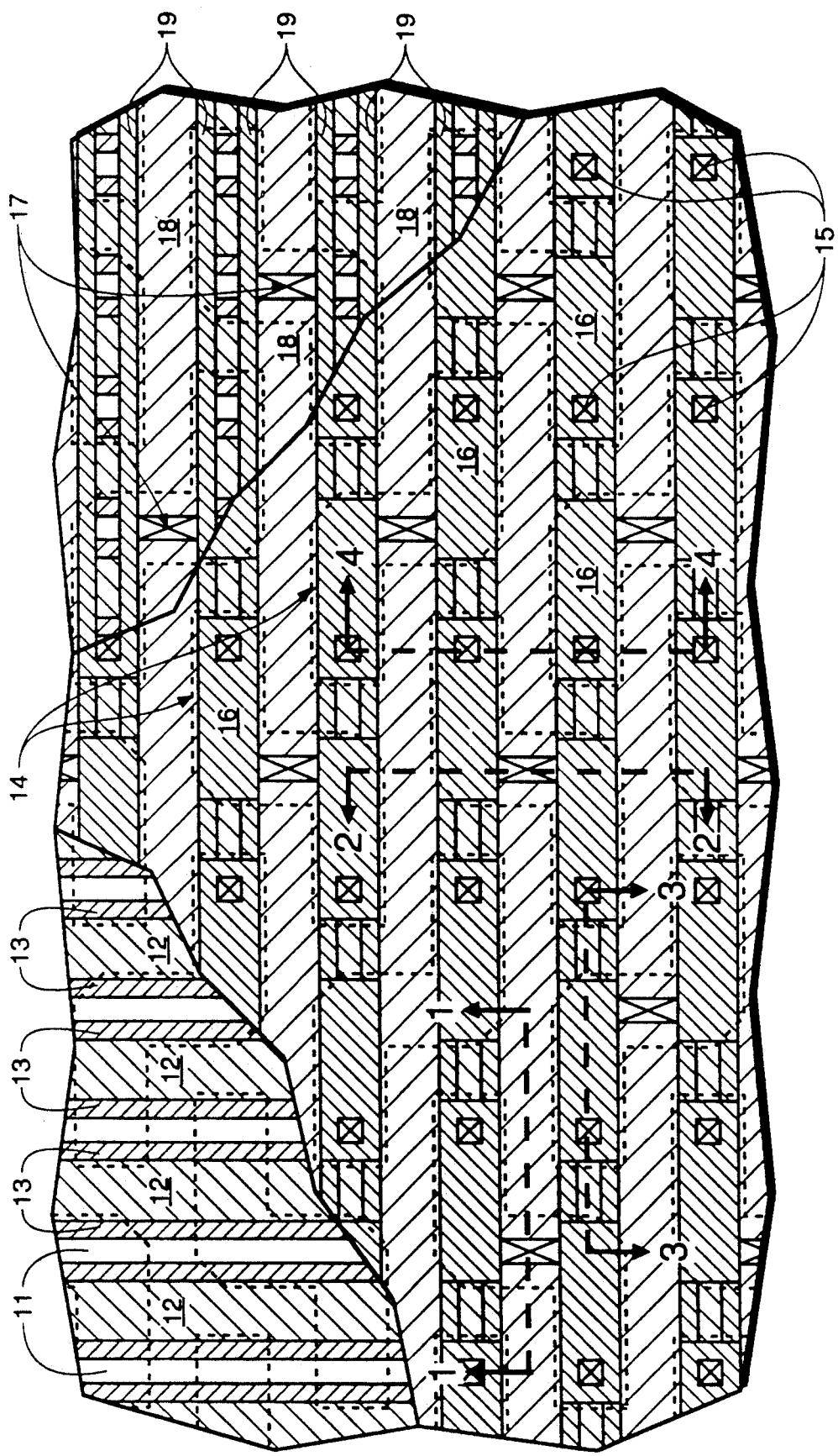
FIG. 1 is partially cutaway, top plan layout of a completed stacked-cell DRAM array that is typical of those in use for the 4-megabit generation of DRAMs. The subsequent drawing figures, which depict steps of the process constituting the invention, are cross-sectional views taken at one of four possible locations through an in-process array of the identical type, which are represented as broken lines 1—1, 2—2, 3—3 and 4—4.

Referring now to FIG. 1, a top plan layout of a completed stacked-cell DRAM array, typical of those in use for the 4-megabit generation of DRAMs, is depicted. The process, which constitutes the present invention, will be described in the context of the fabrication of an array having the same top plan layout as that depicted in FIG. 1. The subsequent drawing figures, which depict steps of the process at various manufacturing stages, are cross-sectional views taken at one of four possible locations within the array, which are represented as broken lines 1—1, 2—2, 3—3, and 4—4.

Still referring to FIG. 1, the completed stacked-cell DRAM memory array, which is fabricated on a monocrystalline silicon substrate 11. A series of substantially parallel, spaced apart, polysilicon wordlines 12 silicided with tungsten, titanium, or other similar refractory metal, each of which is dielectrically coated on its upper surface by a first dielectric capping layer (not shown in this view) on its lateral surfaces by a first set of dielectric spacers 13, and on its lower surface by a gate oxide layer (not shown in this view), traverses substrate 11, in which have been created a multiplicity of bipartite active areas 14 (the square-S-shaped regions bounded by broken lines) which are insulated from one another by field oxide regions (not shown in this view). Each of the horizontal parts of each active area 14, which corresponds to the domain of a single memory cell, contains a storage-node contact region 15 where that cell's storage-node capacitor plate 16 (the X-cross-hatched regions) makes contact to the substrate within the cell's domain. Each pair of cell domains constituting a bipartite active area 14 share a single bitline contact region 17 (these areas of bitline-to-substrate contact are rectangular in shape and marked with an "X"). The substrate region of each cell domain between its storage-node junction region and its shared bitline contact region is subjacent a wordline and forms the channel of that cell's access transistor. Each of the substantially parallel, spaced-apart bitlines 18, in the course of its run through the array, makes contact with a multiplicity of bitline contact regions 17. Each bitline is insulated on its lateral surfaces by a second set of dielectric sidewall spacers 18 and on its upper surface by a second dielectric capping layer (not shown in this view). Although impossible to identify all essential physical elements of the array in the top plan view of FIG. 1, many more of those elements are readily apparent in the following cross-sectional views.

Figure 2A:
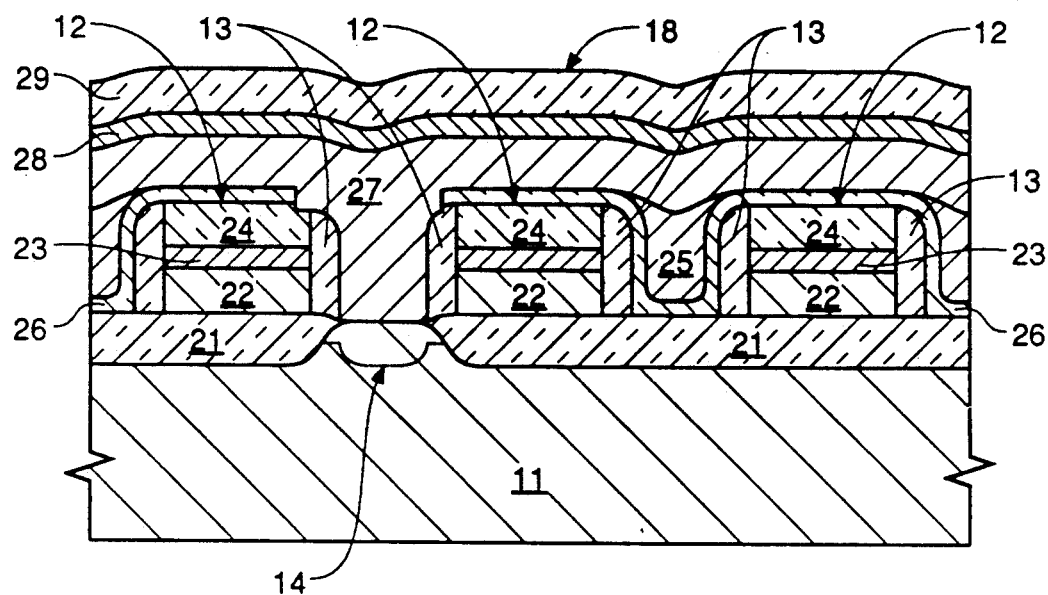
FIGS. 2A, 2B, 2C and 2D are cross-sectional views of the in-process array through broken lines 1—1, 2—2, 3—3 and 4—4, respectively, at the stage in processing just before storage-node contact openings have been created.
Figure 2B:
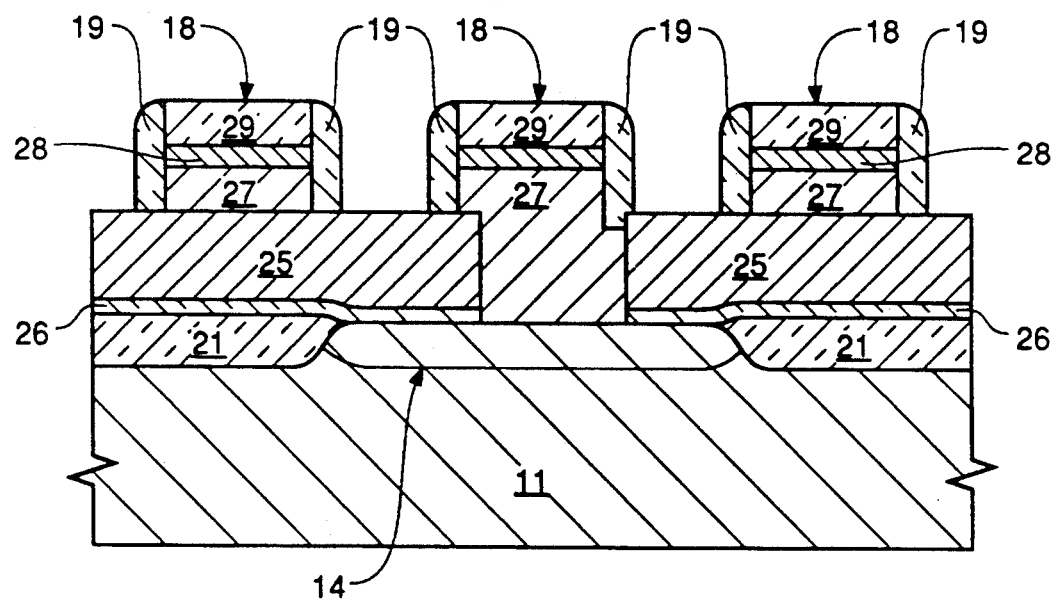
Figure 2C:
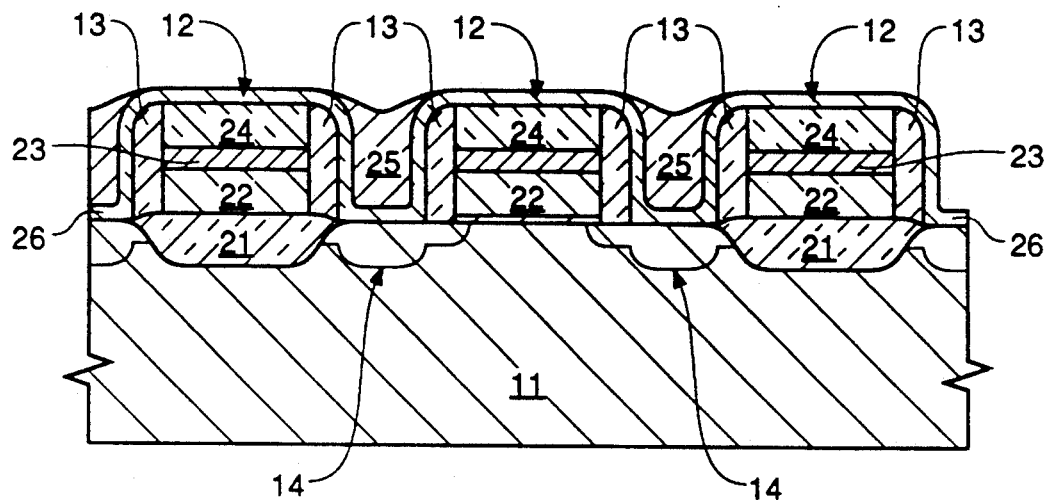

Referring now to FIGS. 2A, 2B, 2C and 2D, the in-process array is shown at a manufacturing stage just prior to the creation of storage-node contact openings. The field oxide regions between active areas 14 are visible in these cross-sectional views. In FIGS. 2A and 2C, field oxide regions 21 are visible, as are three wordlines 12, each of which consists of a first polysilicon layer 22, and a first refractory metal silicide layer 23. The upper surface of each wordline 12 is covered by a remnant of first dielectric capping layer 24 (in this case, silicon dioxide forms the layer), while the sidewalls of each wordline 12 are covered by the first set of sidewall spacers 13. In this particular array, inter-wordline gaps have been filled by silicon nitride strips 25. This feature is incorporated in the array by a process that is the subject of a copending U.S. patent application entitled "Process for Manufacturing Ultra-Dense Dynamic Random Access Memories Using Partially-Disposable Dielectric Fills Strips Between Wordlines" and filed with the U.S. Patent Office on May 3, 1991. The filling of inter-wordline gaps with a partially disposable filler strip solves four performance-degrading problems that are inherent to dynamic memory arrays of stacked-cell design. The first is that of excessive bit line resistance which results in low-speed devices. The second problem is that of excessive bit line capacitance that leads to a reduced bit line sense amp signal. The third problem is that of greater-than-optimum cell width due to the need to provide sufficient overlap between bit line mask and bit line contact mask to prevent unwanted substrate trenching within mask alignment tolerances. The fourth problem is that of spacer build-up in storage-node buried contact regions, brought about by the need to insulate not only the upper surfaces, but also the edges of bit lines. Although the process sequence of the present invention is illustrated in the context of a memory array produced in accordance with the process that is the subject of the aforementioned copending patent application, it will work equally well in a conventional process sequence.

Figure 2D:
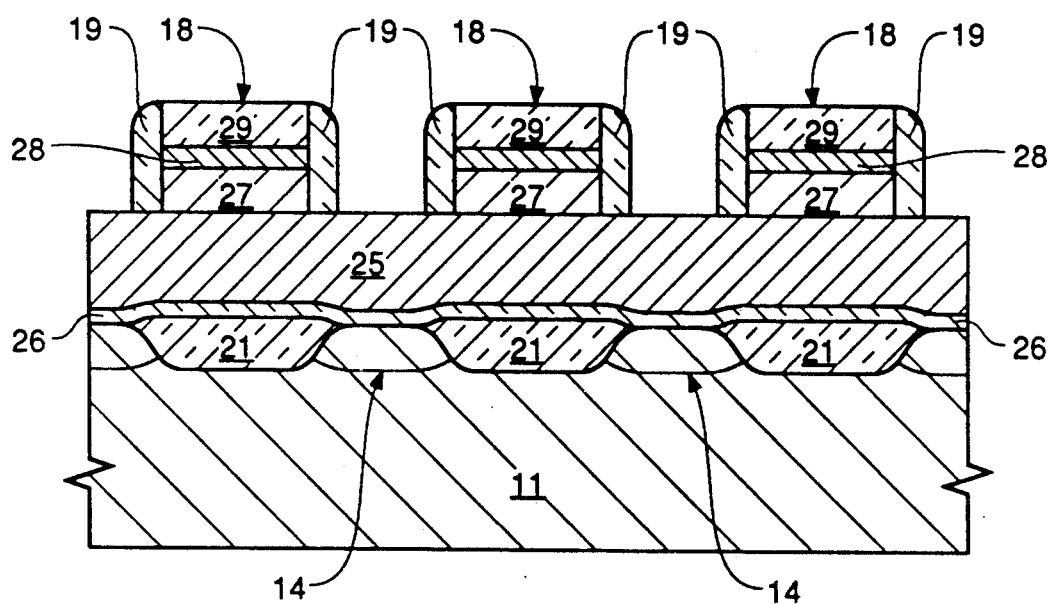

Still referring to FIGS. 2A, 2B, 2C and 2D, a substrate isolation layer 26, that is optional if silicon nitride filler strips 25 are employed, is also depicted. In FIGS. 2B and 2D, three bitlines 18 are visible, each consisting of a second polYsilicon layer 27 and a second refractory metal silicide layer 28. The upper surface of each bitline 18 is covered by a remnant of second dielectric capping layer 29, while the sidewalls of each bitline 18 are covered by the second set of sidewall spacers 19.

Figure 3A:
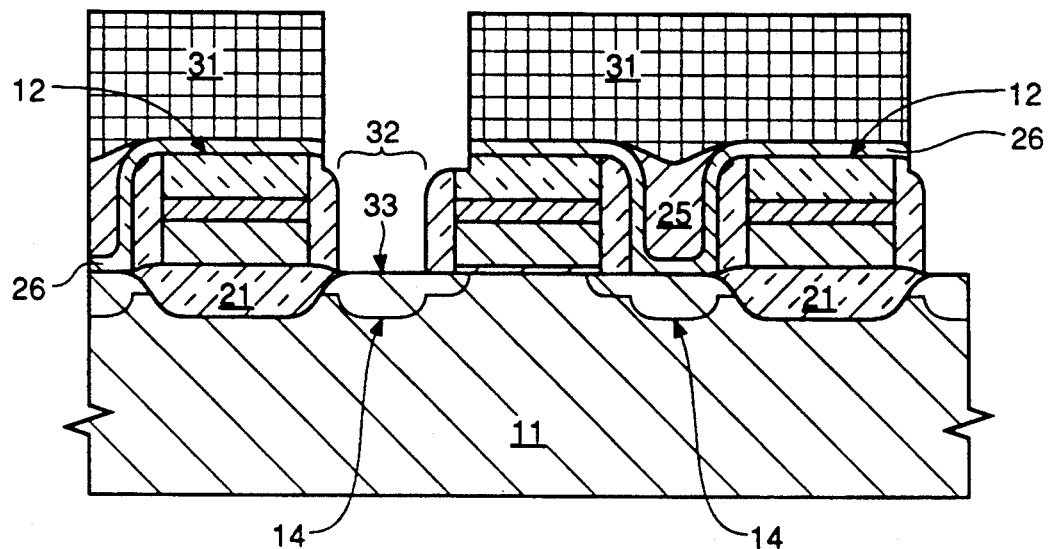
FIGS. 3A and 3B are cross-sectional views of the in-process array of FIGS. 2C and 2D following masking with a storage-node contact photomask and etching anisotropically down to the substrate in the storage-node contact region to create storage-node contact openings.
Figure 3B:
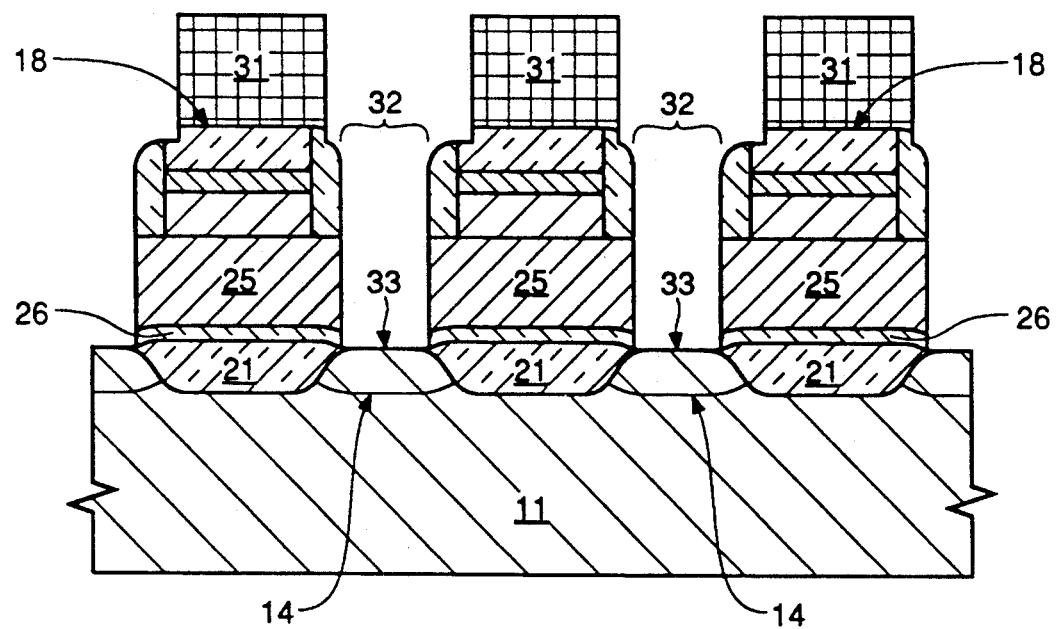

Referring now to FIGS. 3A and 3B, the in-process array of FIGS. 2A, 2B, 2C and 2D is shown at the manufacturing stage where storage-node contact openings have been created by masking with a storage-node contact photomask 31 and etching anisotropically which creates a storage-node contact opening, or shaft, 32 down to the substrate in the storage-node contact region 33. It will be noted that the portion of silicon nitride filler strip 25 that is superjacent the storage-node contact region 33 has been removed by an anisotropic etch highly selective for silicon nitride over silicon dioxide. Likewise, the portion of substrate isolation layer 26 that is superjacent the storage-node contact region 33 has been removed. This is preferably accomplished with a silicon dioxide wet (isotropic) etch.

Figure 4A:
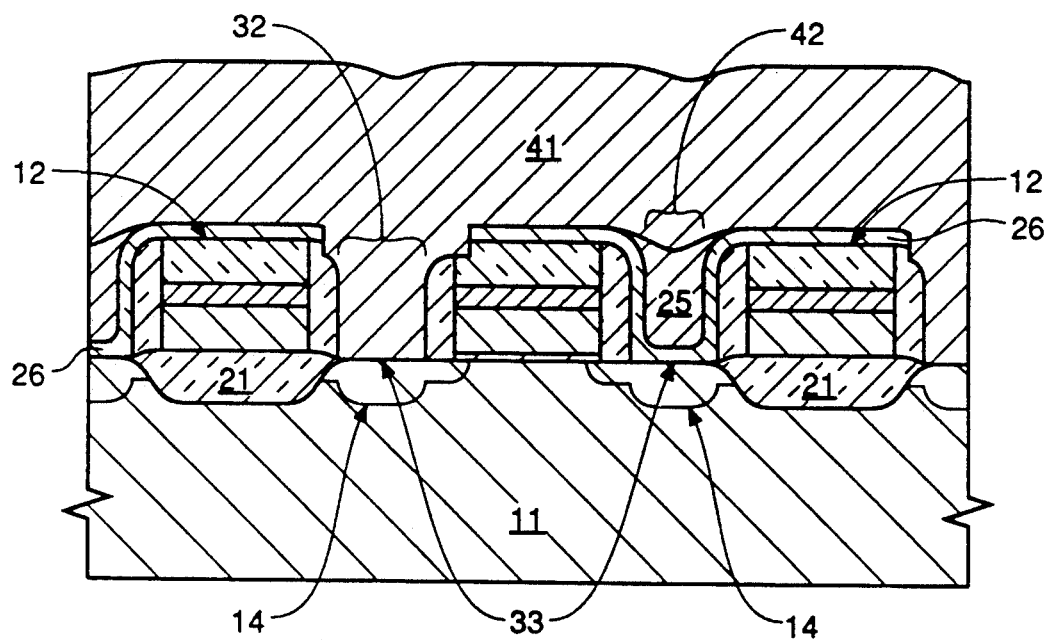
FIGS. 4A and 4B are cross-sectional views of the in-process array of FIGS. 3A and 3B following the conformal deposition of an in-situ doped storage-node poly layer to a depth greater than that necessary to completely fill inter-wordline gaps (if not already planarized) and inter-bitline gaps (in the case of a buried digit line process flow)
Figure 4B:
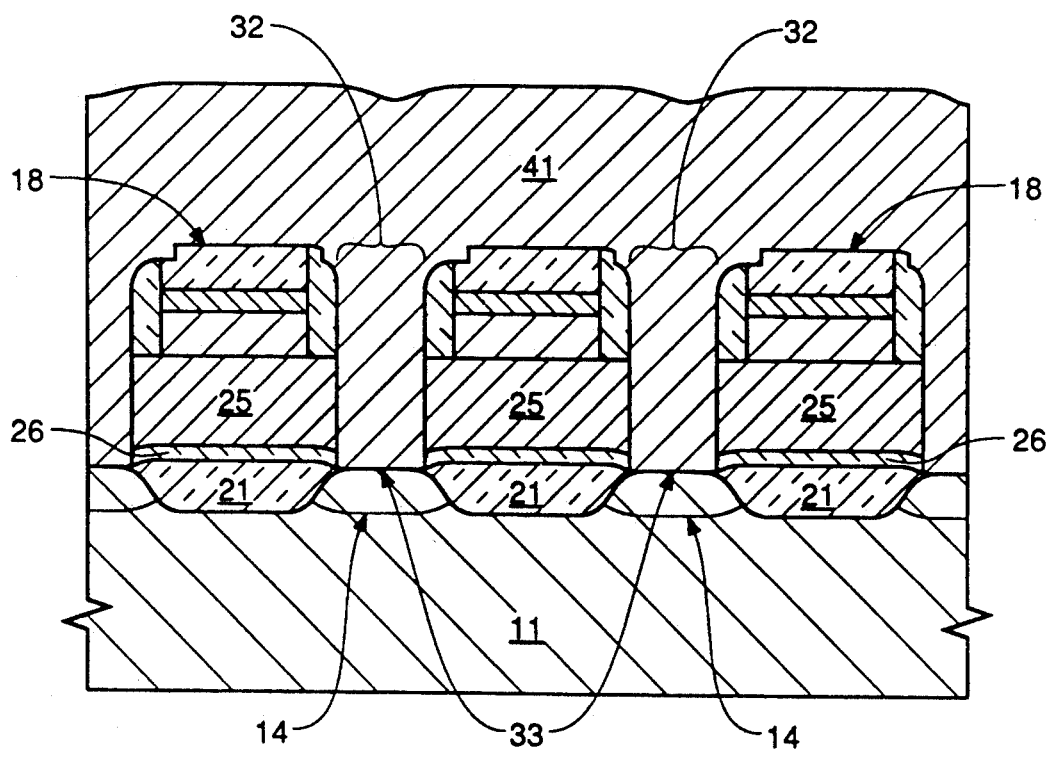

Referring now to FIGS. 4A and 4B, the in-process array of FIGS. 3A and 3B has been subjected to blanket, conformal deposition of an in-situ doped storage-node poly layer 41 to a depth greater than that necessary to completely fill the storage node contact shaft 32, inter-wordline gaps 42 (if not already filled with silicon nitride filler strips 26) and inter-bitline gaps 43 (in the case of a buried digit line process flow such as is depicted in these drawings figures).

Figure 5A:
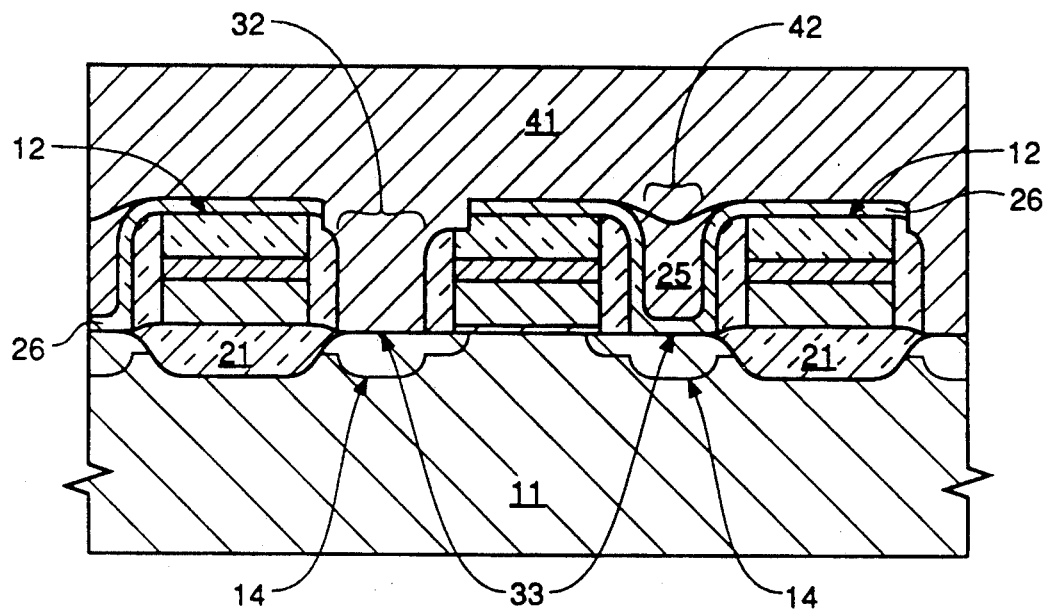
FIGS. 5A and 5B are cross-sectional views of the in-process array of FIGS. 4A and 4B following planarazation of the storage-node poly layer to a level at which poly still covers the entire array.
Figure 5B:
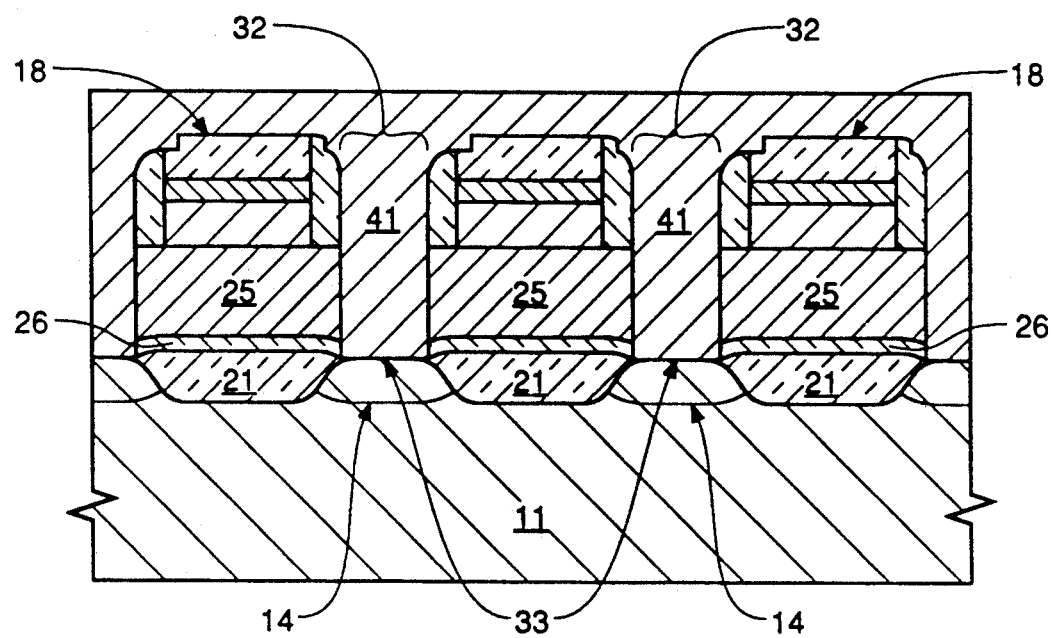

Referring now to FIGS. 5A and 5B, the in-process-array of FIGS. 4A and 4B has been subjected to a chemical-mechanical planarization (CMP) step, which has planarized storage-node poly layer 41 to a level where polYsilicon still covers the entire array. Other available planarization techniques may be used.

Figure 6A:
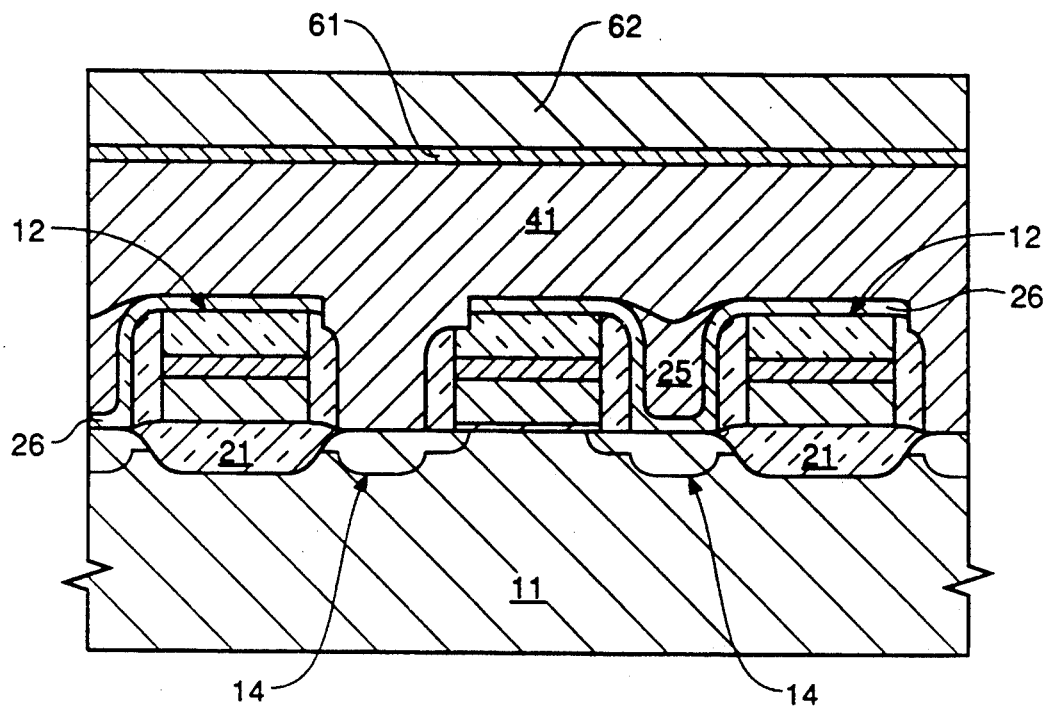
FIGS. 6A and 6B are cross-sectional view of the in-process array of FIGS. 5C and 5D following the deposition of a barrier layer of a refractory metal or a refractory metal silicide on top of the planarized storage-node poly layer, and the deposition of a disposable polymer layer on top of the barrier layer, to a depth that is at least that of the desired thickness of the PZT dielectric layer, which will be subsequently deposited.
Figure 6B:
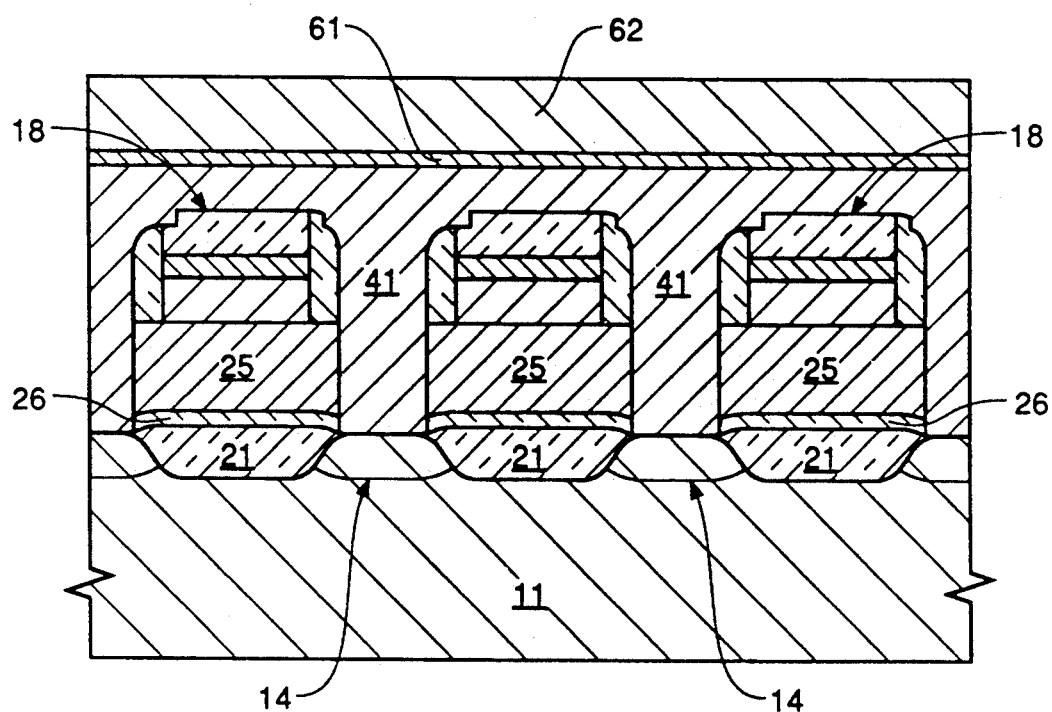

Referring now to FIGS. 6A and 6B, an electrically-conductive refractory metal or a refractory metal silicide barrier layer 61 has been blanket deposited over the entire array, completely covering planarized storage-node polysilicon layer 41. This is followed by the blanket deposition of a disposable polymer layer 62 on top of the barrier layer 61, to a depth that is at least that of the desired thickness of a PZT dielectric layer, which will be subsequently deposited. Polyimide may be utilized for disposable polyimide layer 62.

Figure 7A:
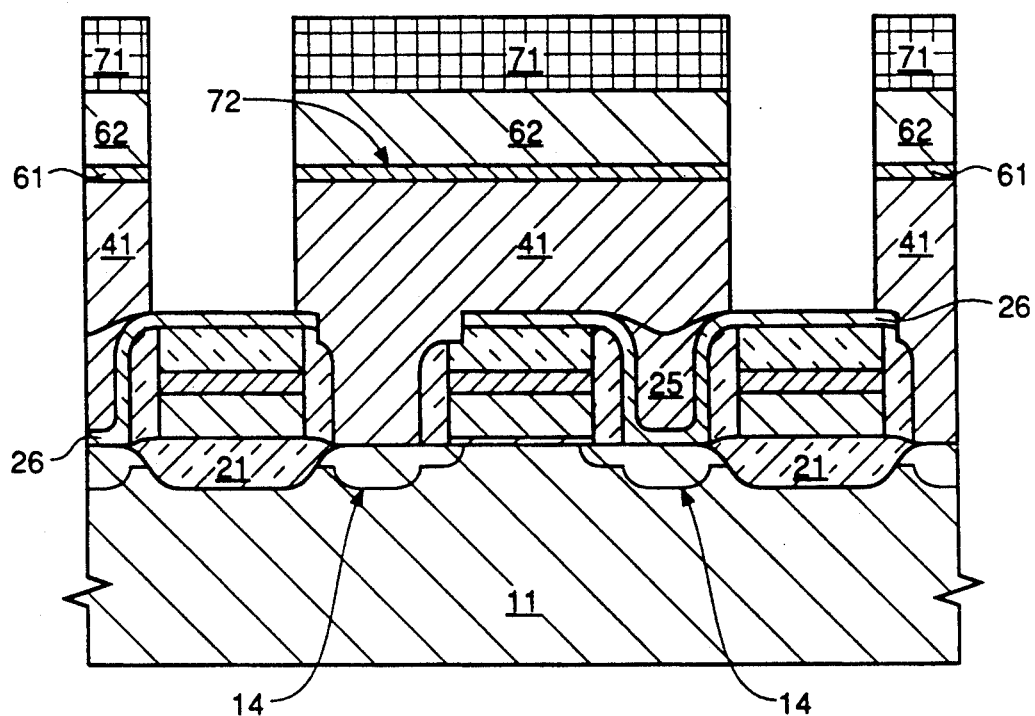
FIGS. 7A and 7B are cross-sectional view of the in-process array of FIGS. 6A and 6B following the patterning of the disposable polymer layer with photoresist, and single-step anisotropic etch of the polymer layer, the barrier layer, and the storage-node poly layer to create polyimide-covered storage node plates.
Figure 7B:
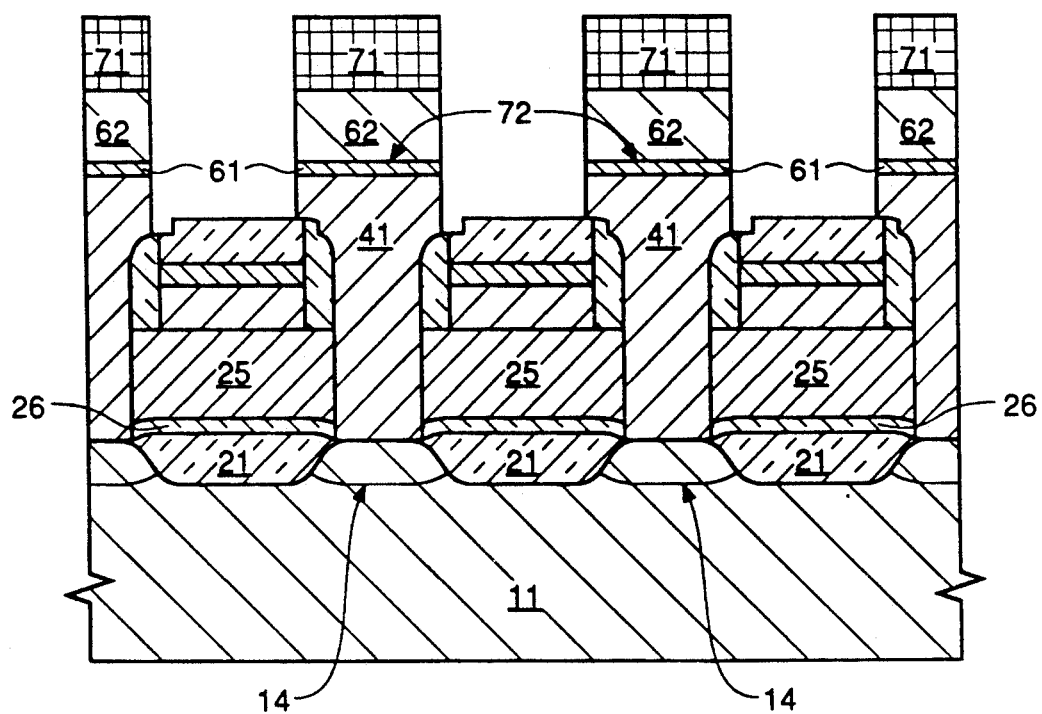

Referring now to FIGS. 7A and 7B, the in-process array of FIGS. 6A and 6B is shown following patterning of the disposable polymer layer 62 with a storage-node photomask 71, and a single-step anisotropic etch of polymer layer 62, the barrier layer 61, and storage-node poly layer 41 to create polyimide-covered storage node plates 72.

Figure 8A:
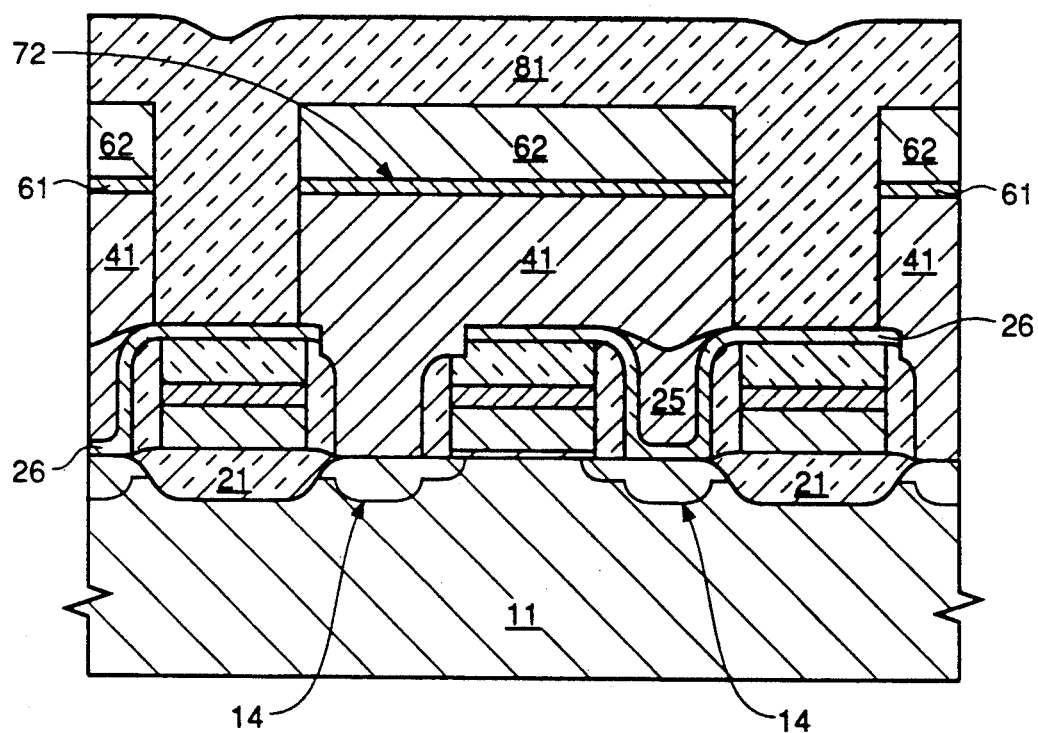
FIGS. 8A and 8B are cross-sectional view of the in-process array of FIGS. 7A and 7B following the low-temperature chemical vapor deposition of a cell-isolation dielectric layer, to a thickness that completely fills the gaps between the remnants of the disposable layer.
Figure 8B:
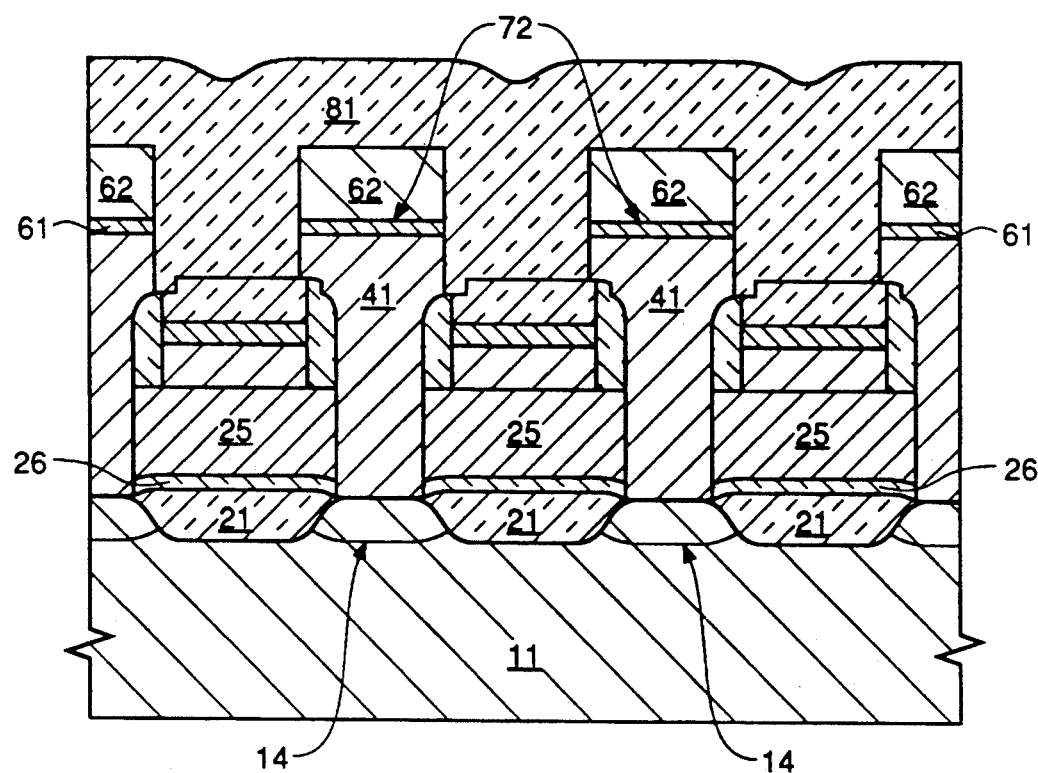

Referring now to FIGS. 8A and 8B, the in-process array of FIGS. 7A and 7B is shown following the blanket deposition of a suitable cell isolation dielectric layer 81 (e.g., silicon dioxide) with a low-temperature chemical vapor deposition process. Cell isolation dielectric layer 81 is made sufficiently thick to completely fill the gaps between the remnants of the disposable polymer layer 62.

Figure 9A:
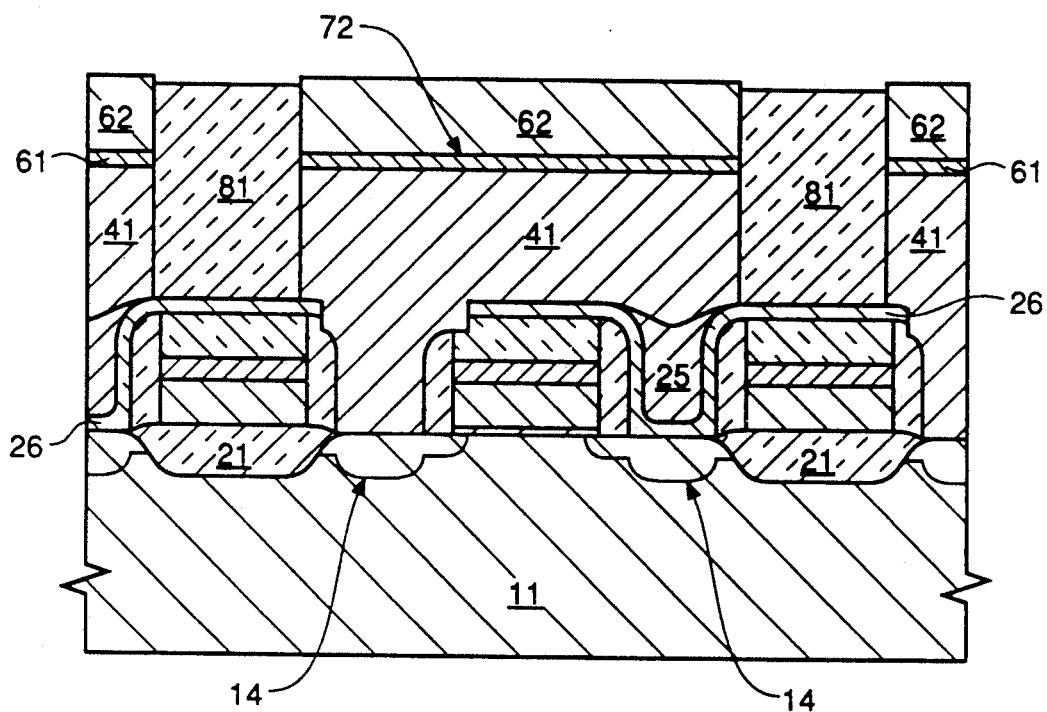
FIGS. 9A and 9B are cross-sectional views of the in-process array of FIGS. 8A and 8B following a first embodiment planarization step, which planarizes the cell-isolation dielectric layer down to a level where both the difference between its elevation and the upper surface of the barrier layer is substantially equal to the desired depth of the PZT dielectric that will be subsequently deposited, and the upper surface of each disposable polymer layer remnant is exposed.
Figure 9B:
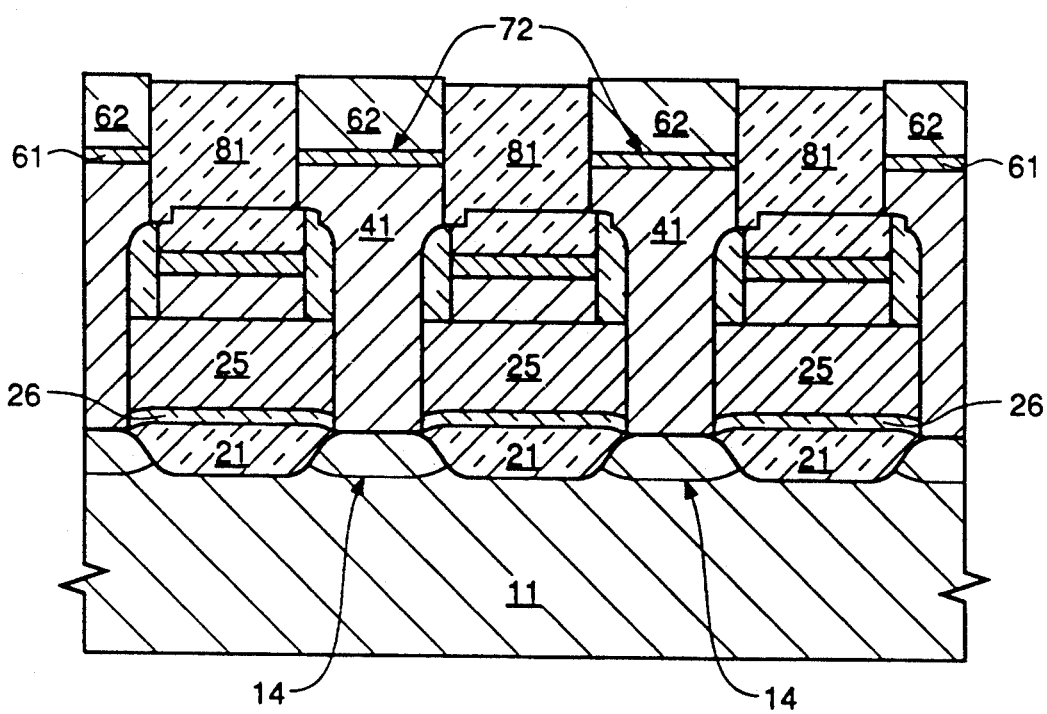

Referring now to FIGS. 9A and 9B, the in-process array of FIGS. 8A and 8B is shown following a first embodiment planarization of the cell isolation dielectric layer 81 down to a level where both the difference between its elevation and the upper surface of the barrier layer 61 is substantially equal to the desired depth of the PZT dielectric that will be subsequently deposited, and the upper surface of each remnant of disposable polymer layer 62 is exposed. Planarization of cell isolation dielectric layer 81 may be effectively accomplished by a photoresist coat and plasma etch back.

Figure 10A:
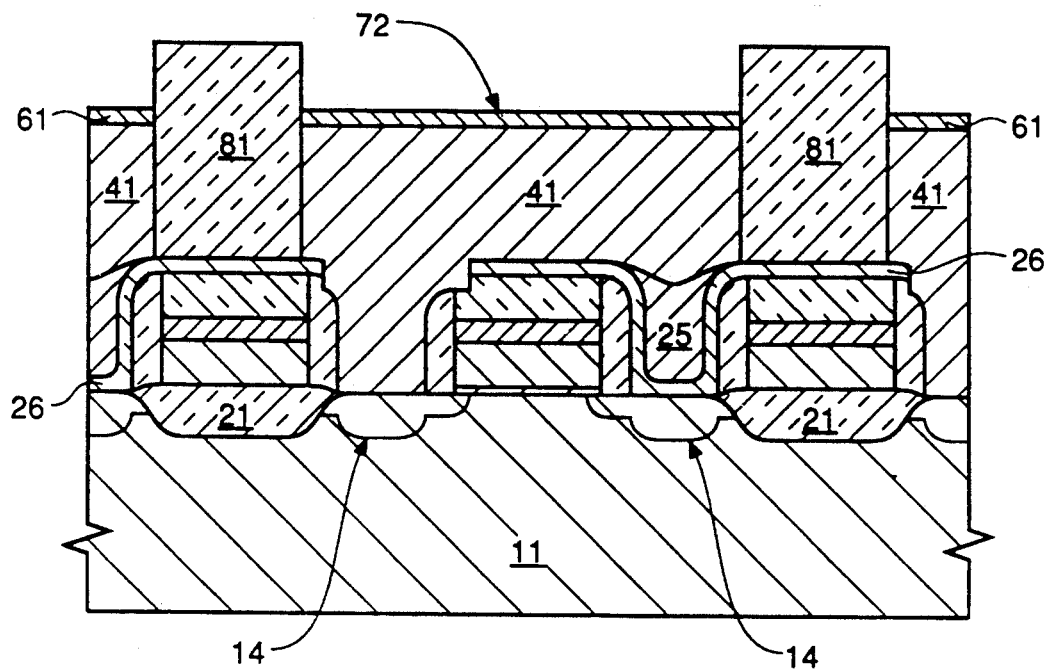
FIGS. 10A and 10B are cross-sectional views of the in-process array of FIGS. 9A and 9B following removal of the disposable polymer layer remnants.
Figure 10B:
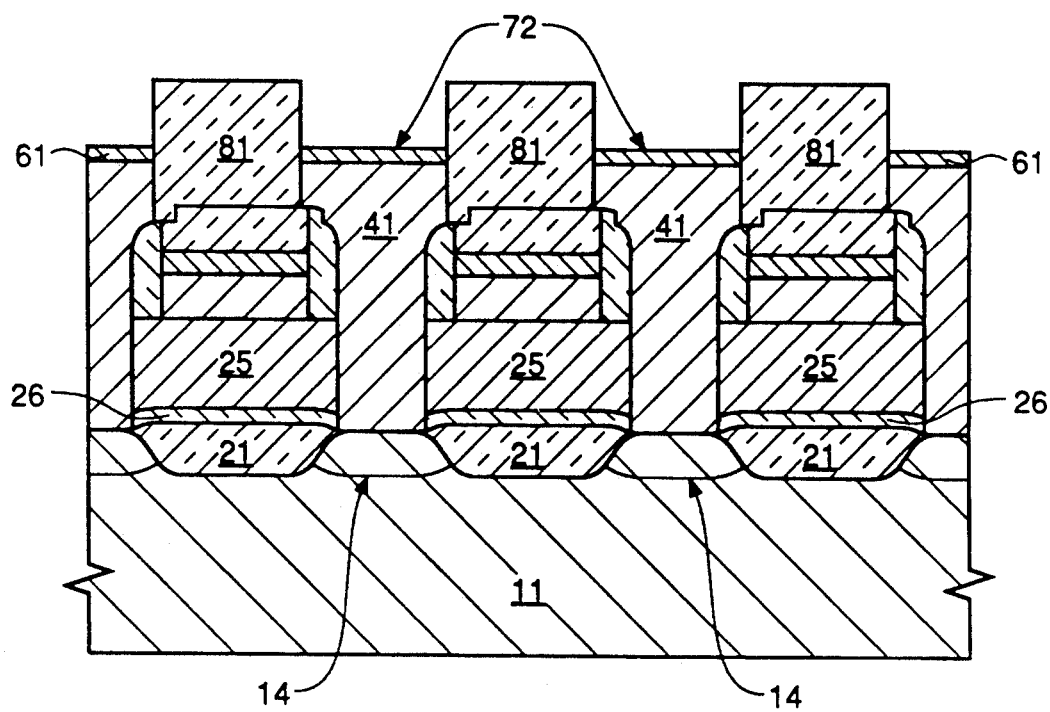

Referring now to FIGS. 10A and 10B, the in-process array of FIGS. 9A and 9B is shown following removal of remnants of disposable polymer layer 62. If polyimide is used for disposable polymer layer 62, remnants thereof may be removed with an oxygen plasma etch with the removal of virtually no other materials within the array structure.

Figure 11A:
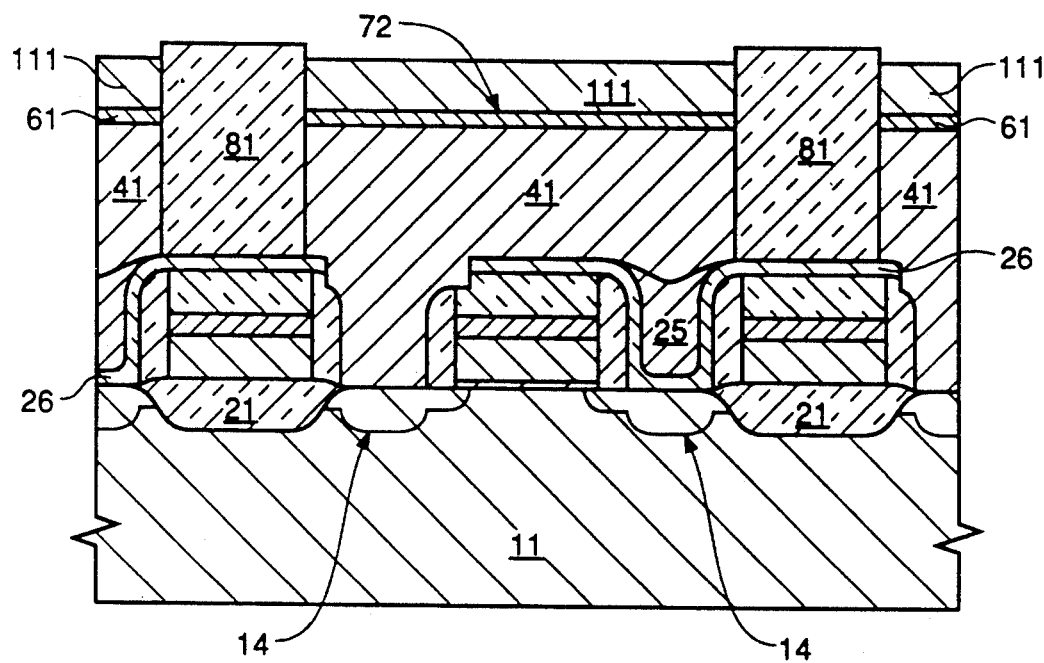
FIGS. 11A and 11B are cross-sectional views of the in-process array of FIGS. 10A and 10B following the deposition of a PZT layer via the solution-gelatin technique to a depth approximately equal to the level of the upper surface of the planarized dielectric layer.
Figure 11B:
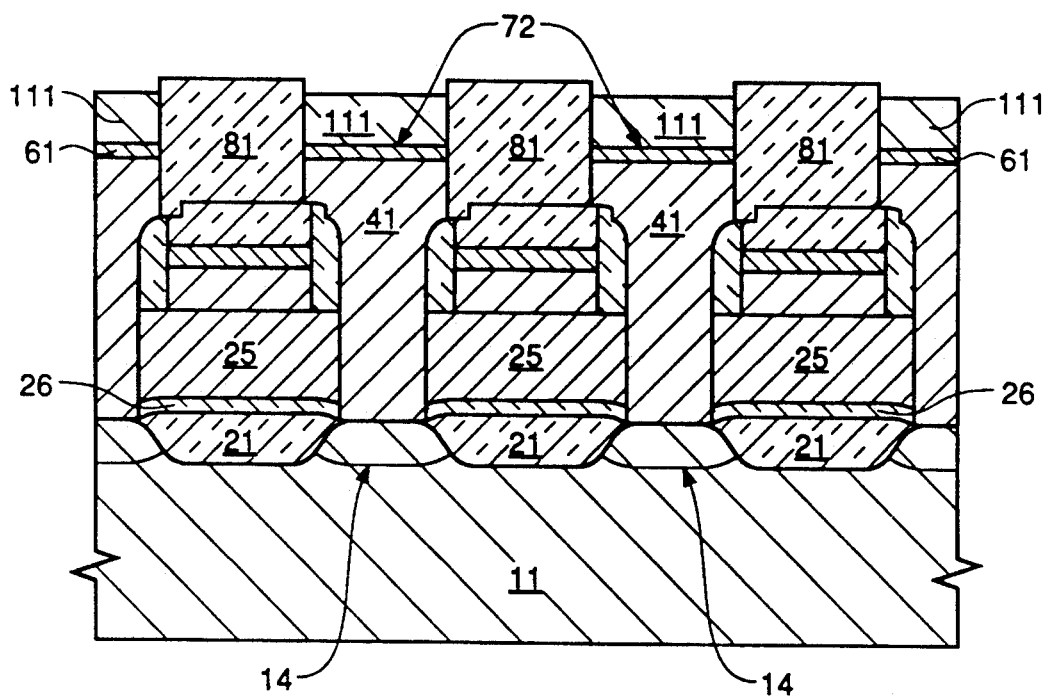
Figure 12A:
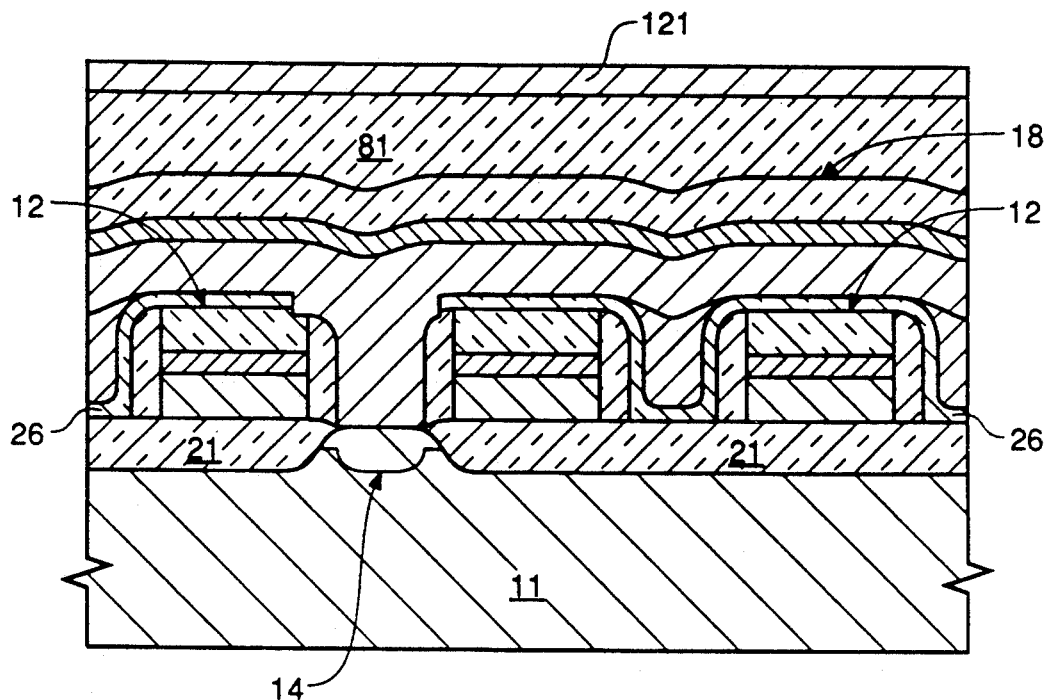
FIGS. 12A, 12B, 12C and 12D are cross-sectional views of the in-process array of FIGS. 10A and 10B through broken lines 1—1, 2—2, 3—3, and 4—4, respectively following the annealing of the PZT layer and deposition of a refractory metal or refractory metal silicide cell plate layer.
Figure 12B:
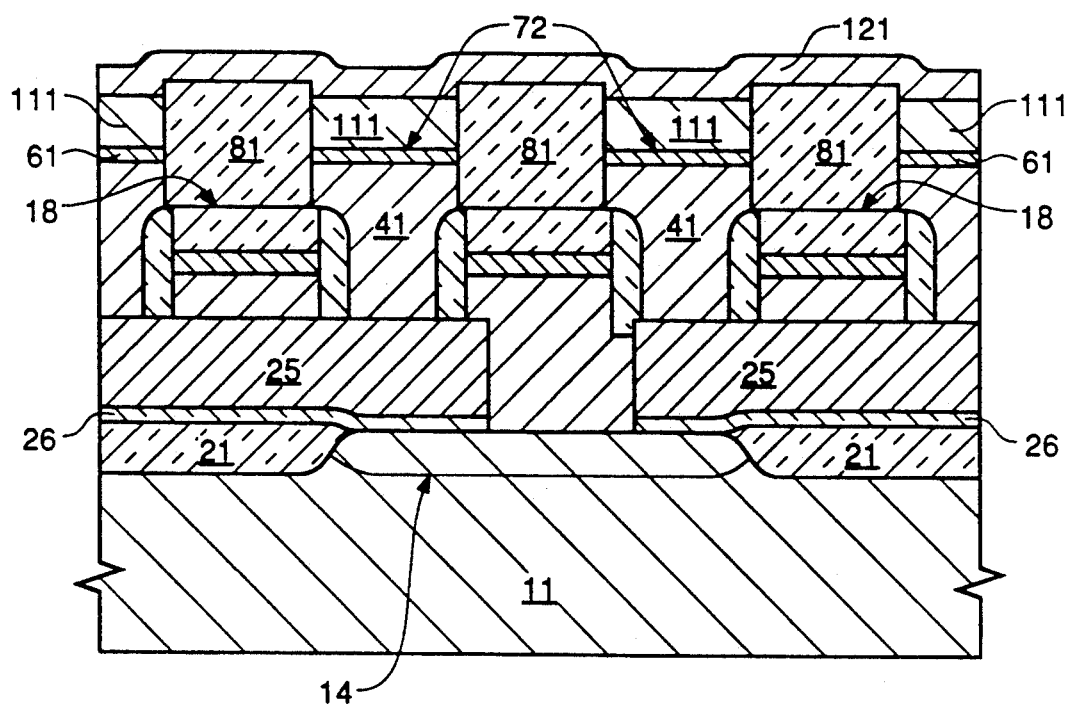
Figure 12C:
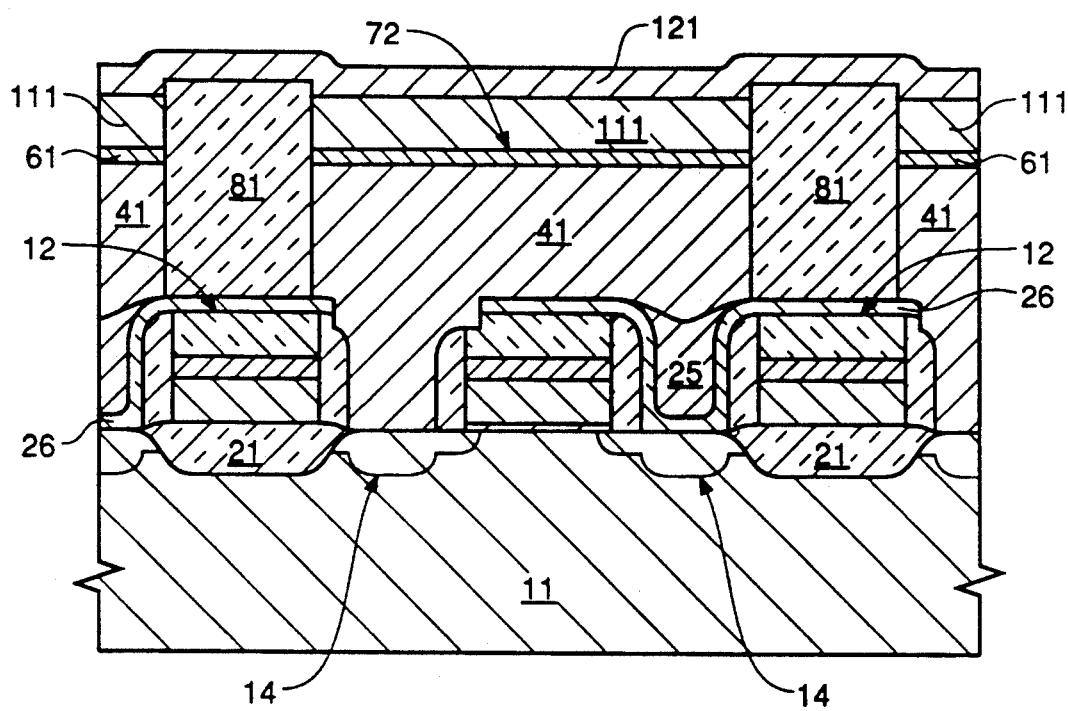
Figure 12D:
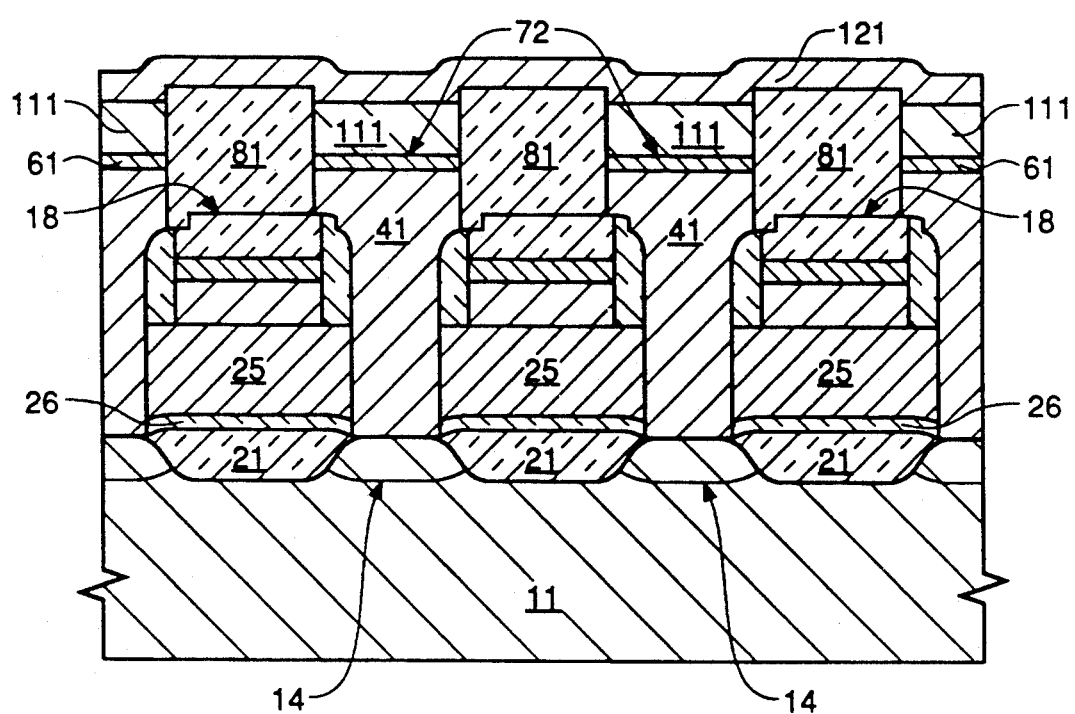

Referring now to FIGS. 11A and 11B, the in-process array of FIGS. 10A and 10B is shown following deposition of a PZT layer 111, via the well-known solution-gelatin technique, to a depth approximately equal to the level of the upper surface of cell isolation layer 81.

Referring now to FIGS. 12A, 12B, 12C and 12D, the in-process array of FIGS. 10A and 10B is shown following annealing of PZT layer 111 and deposition of a refractory metal or refractory metal silicide cell plate layer 121.

Figure 13A:
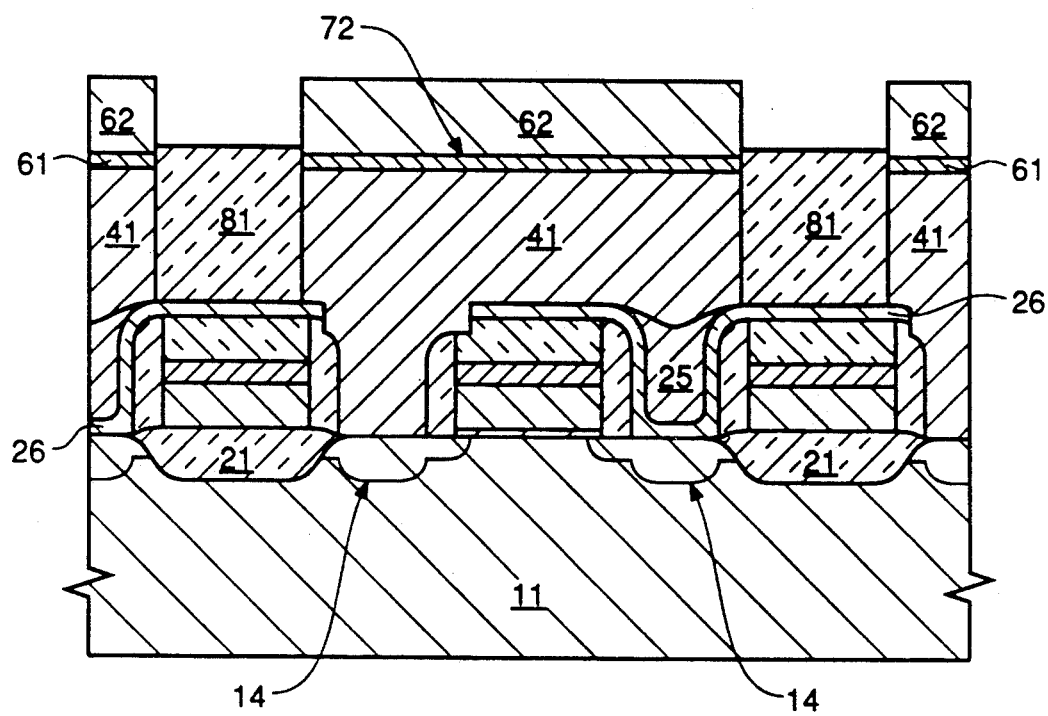
FIGS. 13A and 13B are cross-sectional views of the in-process array of FIGS. 8A and 8B following a second embodiment planarization step, which planarizes the cell-isolation dielectric layer down to a level that is substantially equal to the upper surface of the barrier layer.
Figure 13B:
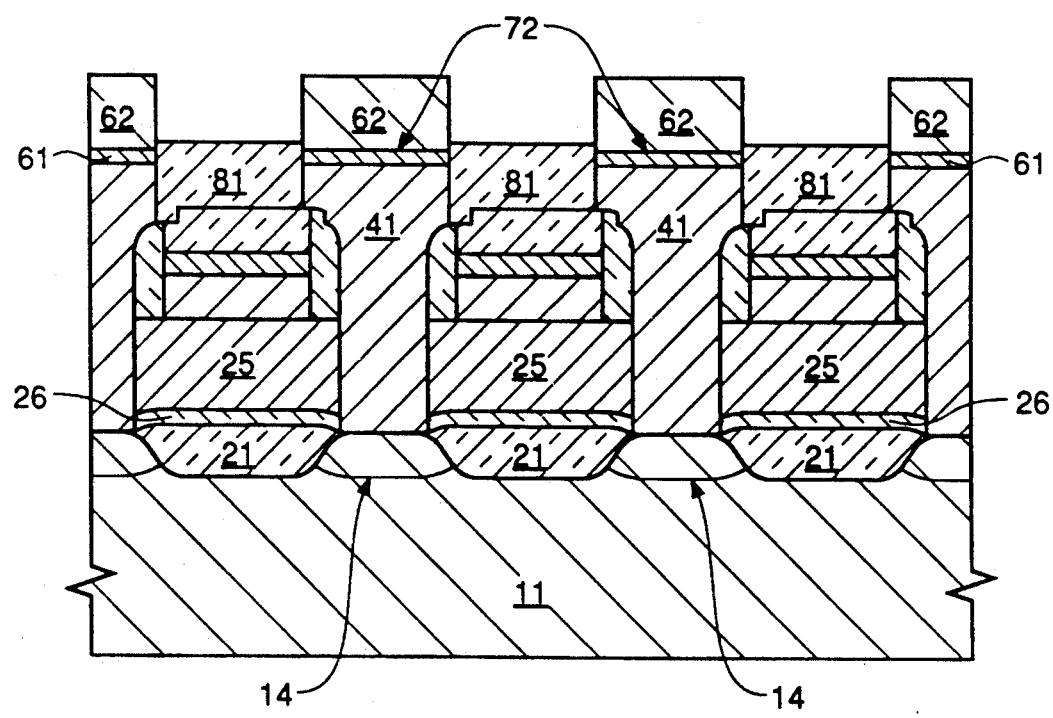

Referring now to FIGS. 13A and 13B, the in-process array of FIGS. 8A and 8B is shown following a second embodiment panarization of the cell isolation dielectric layer 81 down to a level that is substantially equal to the upper surface of the barrier layer 61. Planarization of cell isolation dielectric layer 81 may be effectively accomplished by a photoresist coat and plasma etch back.

Figure 14A:
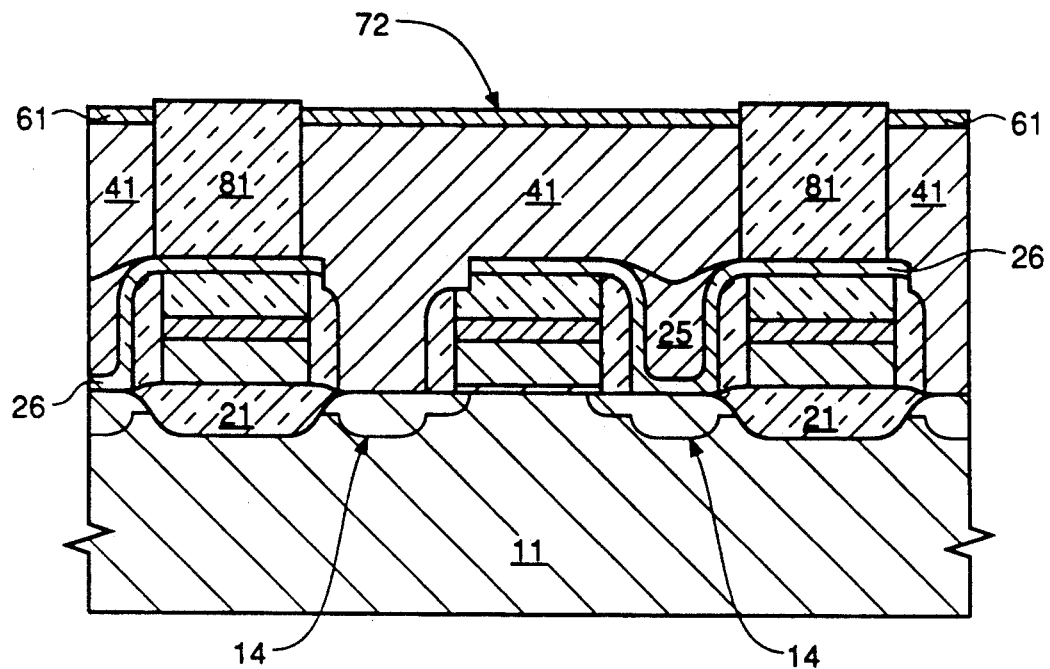
FIGS. 14A and 14B are cross-sectional views of the in-process array of FIGS. 13A and 13B following removal Of the disposable polymer layer remnants.
Figure 14B:
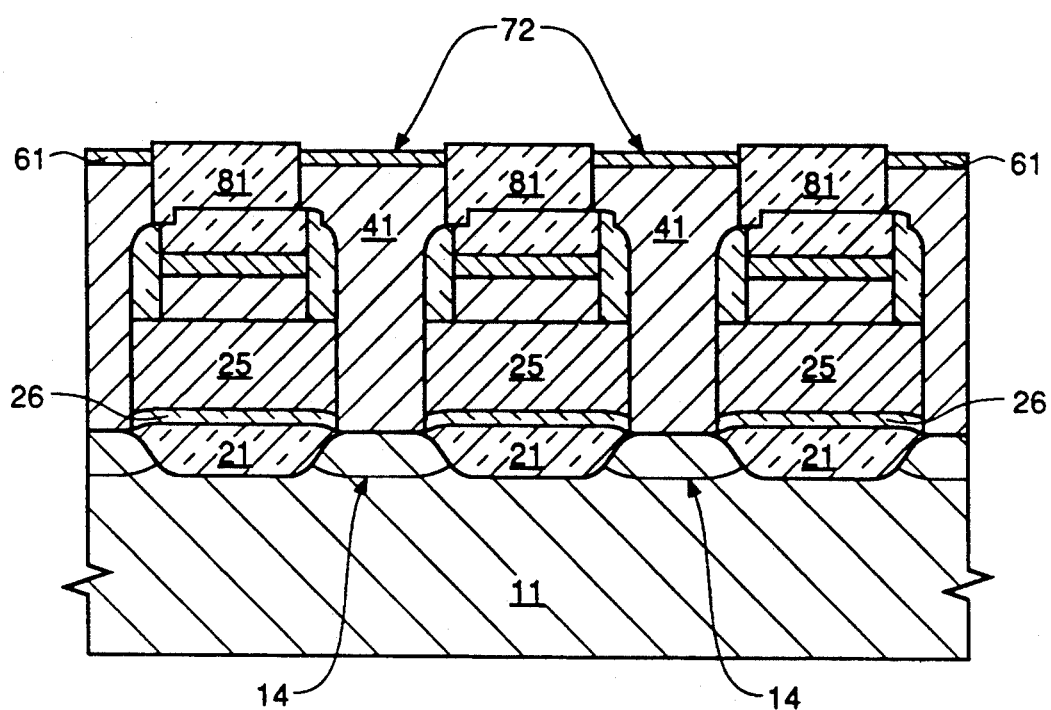

Referring now to FIGS. 14A and 14B, the in-process array of FIGS. 13A and 13B is shown following removal of remnants of disposable polymer layer 62. If polyimide is used for disposable polymer layer 62, remnants thereof may be removed with an oxygen plasma etch with the removal of virtually no other materials within the array structure.

Figure 15A:
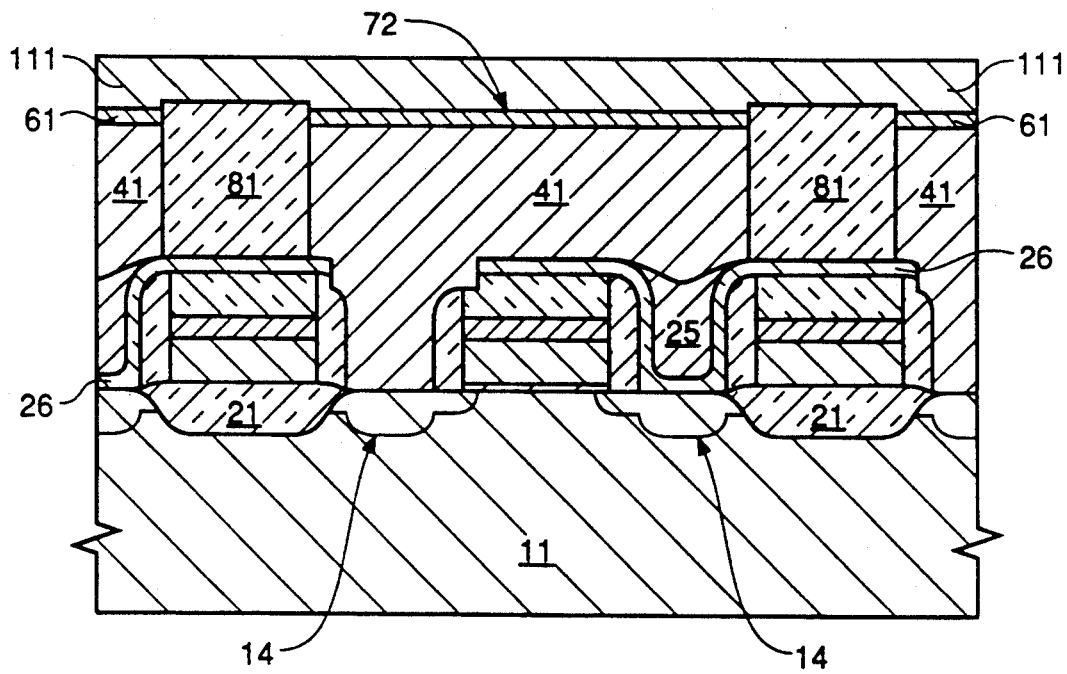
FIGS. 15A and 15B are cross-sectional views of the in-process array of FIGS. 14A and 14B following the deposition of a PZT layer via sputtering.
Figure 15B:
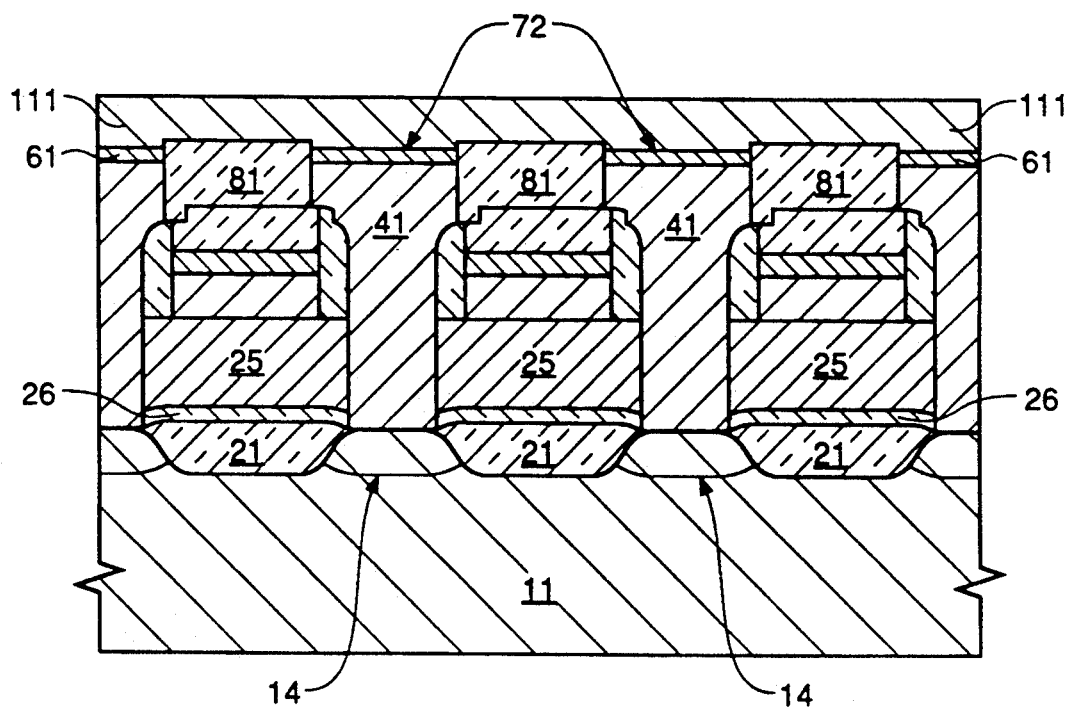
Figure 16A:
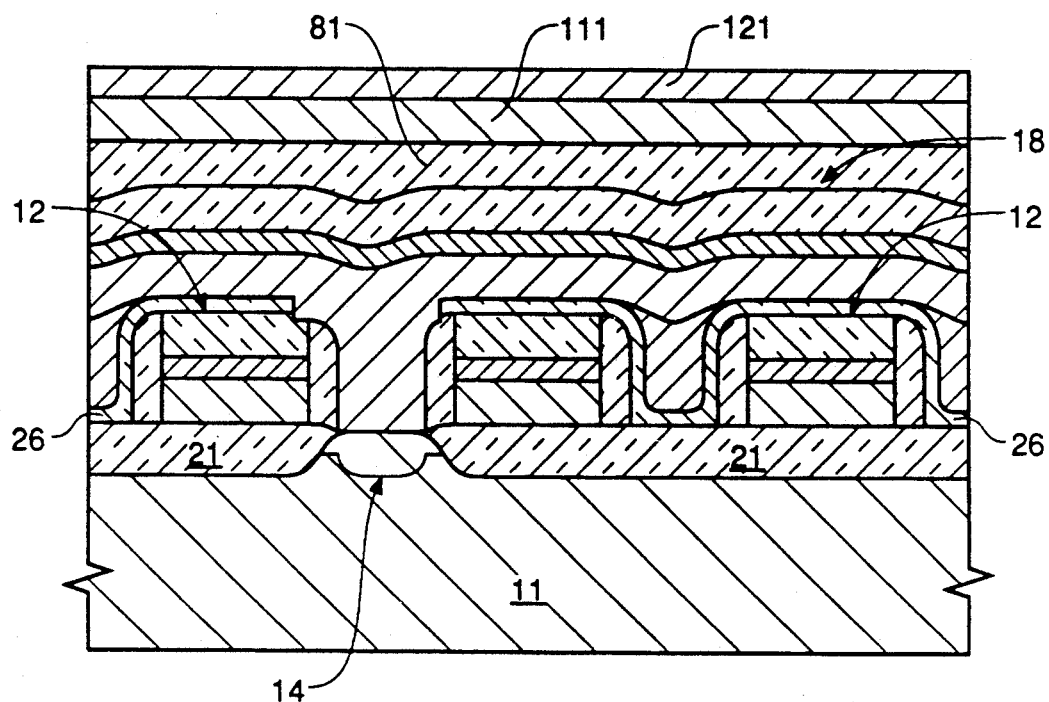
FIGS. 16A, 16B, 16C and 16D are cross-sectional views of the in-process array of FIGS. 15A and 15B through broken lines 1—1, 2—2, 3—3, and 4—4, respectively following the annealing of the PZT layer and deposition of a refractory metal or refractory metal silicide cell plate layer.
Figure 16B:
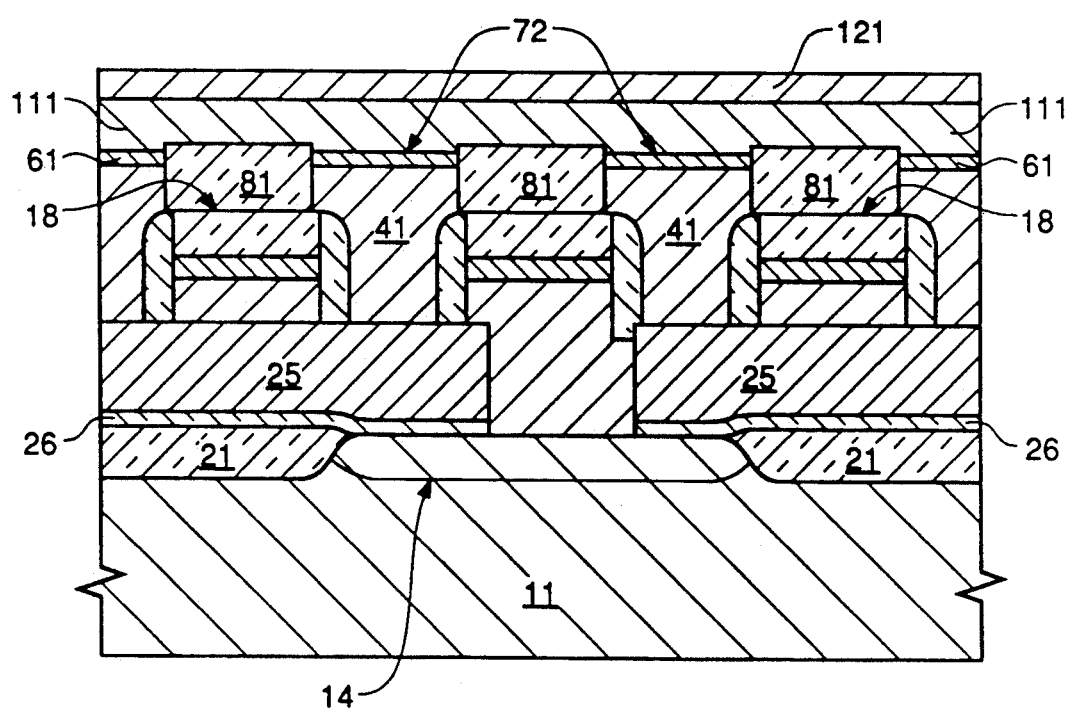
Figure 16C:
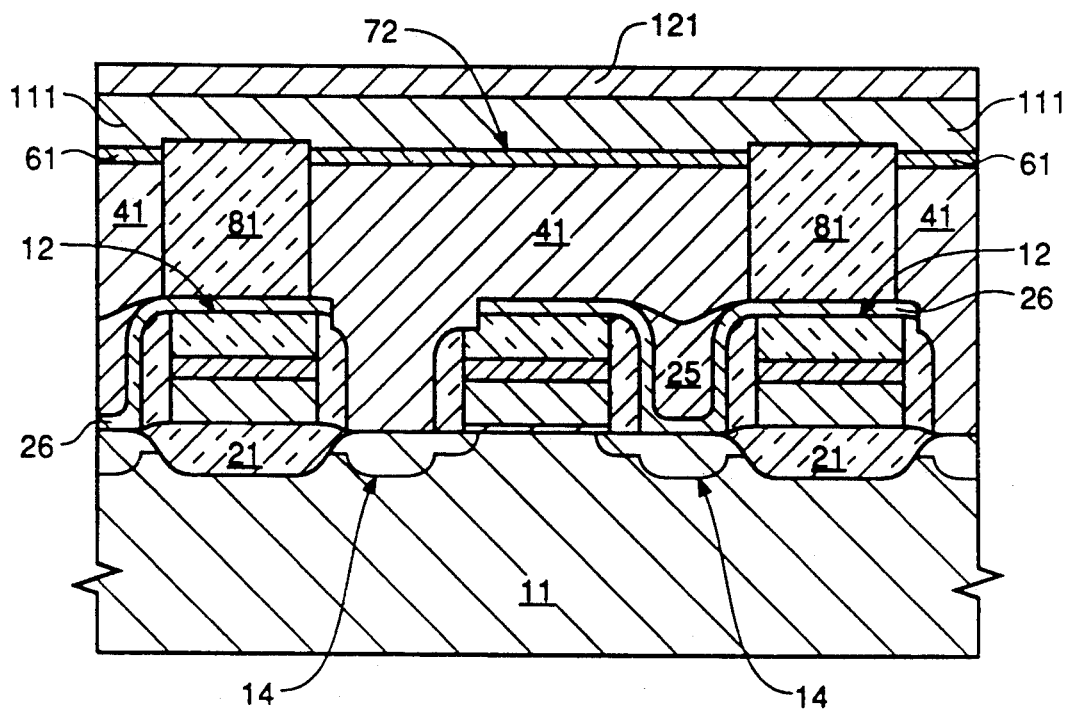
Figure 16D:
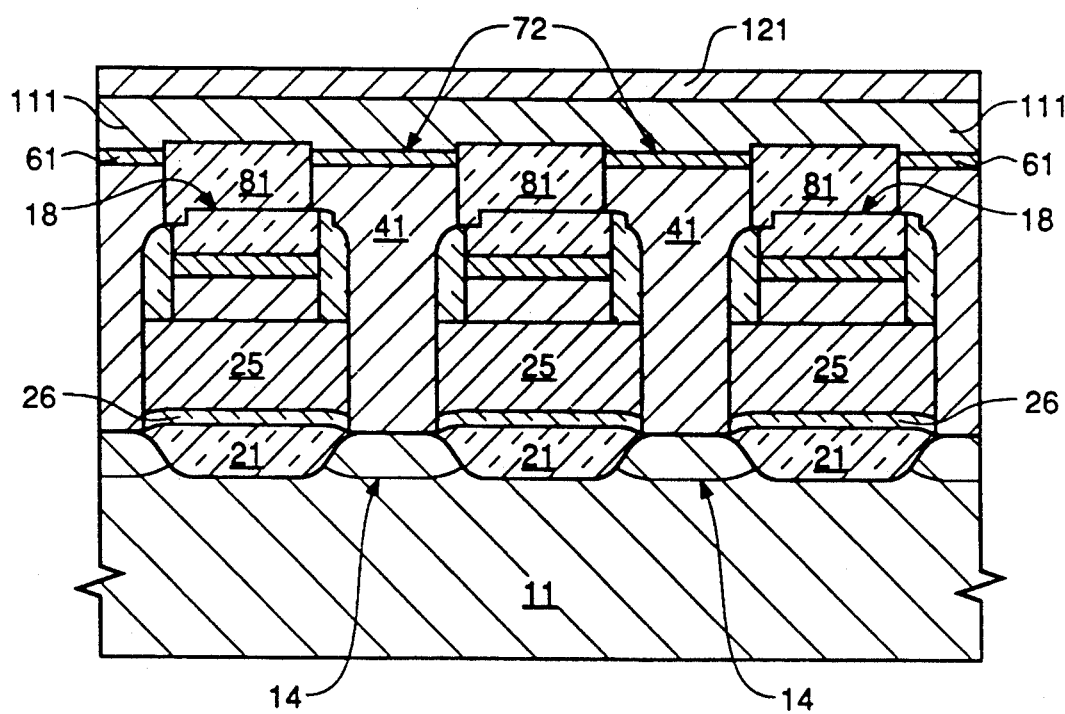

Referring now to FIGS. 15A and 15B, the in-process array of FIGS. 14A and 14B is shown following deposition of a PZT layer 111, via sputtering.

Referring now to FIGS. 16A, 16B, 16C and 16D, the in-process array of FIGS. 15A and 15B is shown following annealing of PZT layer 111 and deposition of a refractory metal or refractory metal silicide cell plate layer 121. Although an array manufactured using the second embodiment of the process has a slightly higher intercellular capcitance than an array manufactured using the first embodiment of the process, it is still well within an acceptable range.

The array, whether produced using the first embodiment process or the second embodiment process, may now be completed using processing techniques that are well known in the art. Although only a single embodiment of the process has been disclosed herein, it will be obvious to those having ordinary skill in the art that changes and modifications may be made to the process without departing from the scope and spirit of the invention as claimed. For example, other materials, such as fluorocarbon polymers, may be substituted for disposable polymer layer 62. Additionally, dielectric materials other than silicon dioxide (e.g., silicon nitride) may be substituted for the cell isolation layer. Furthermore, although the process was depicted with reference to a buried bitline process flow, it may be easily adapted to a process utilizing non-buried bitlines. In such a case, the cell capacitors would be constructed on top of word lines, and bitlines would be fabricated following capacitor formation in accordance with well-known processing techniques.

I claim:

1. A process for fabricating capacitors having a ferroelectric dielectric layer within a memory array that can be operated in both dynamic and non-volatile modes, said array having a conventional stacked-cell layout in which a series of substantially parallel, spaced apart wordlines, each of which is dielectrically coated on its lower, upper and lateral surfaces, traverses a substrate in which have been created a multiplicity of bipartite active areas which are insulated from one another by field oxide regions, each of the parts of each bipartite active area corresponding to the domain of an individual cell, and containing a storage-node contact region, the pair of domains constituting an active area being separated by a shared central region where bitline contact is made, the region of each domain between that domain's storage-node contact region and the shared bitline contact region being subjacent a wordline and forming the channel of that cell's access transistor, said array also having a series of substantially parallel, spaced-apart bitlines, each of which is dielectrically coated on its upper and lateral surfaces, and which overlie and intersect the dielectrically- coated wordlines, said process commencing at a stage in the manufacturing process where storage-node contact regions are exposed by masking the array with a storage-node contact photomask and performing an etch to clear the substrate in those regions, and said process comprising the following sequence of steps:

a) conformal deposition of an in-situ doped storage-node polysilicon layer to a depth greater than that necessary to completely fill any inter-wordline and inter-bitline gaps;
b) planarization of the storage-node poly layer to a level at which poly still covers the entire array;
c) deposition of a conductive barrier layer on top of the planarized storage-node poly layer;
d) deposition of a disposable polymer layer on top of the barrier layer;
e) masking the disposable polymer layer with a photomask which patterns storage-node capacitor plates;
f) anisotropically etching the disposable polymer layer, the barrier layer and the storage-node poly layer in a single step in order to create non-contiguous disposable layer, barrier layer, and storage-node poly layer remnants;
g) blanket deposition of a cell-isolation dielectric layer at a temperature sufficiently low to prevent decomposition of the disposable polymer layer remnants, said cell-isolation layer being of sufficient depth to completely fill gaps between the disposable layer remnants;
h) planarization of the cell-isolation dielectric layer to a level that exposes each disposable polymer layer remnant;
i) removal of the disposable polymer layer remnants;
j) deposition of a ferroelectric dielectric layer;
k) annealing the ferroelectric dielectric layer; and
l) deposition of a cell plate layer;

2. The process of claim 1, wherein planarization of said storage-node poly layer is performed via chemical-mechanical planarization (CMP).

3. The process of claim 1, wherein planarization of said storage-node poly layer is performed with a plasma etch back step following the blanket deposition of a planar layer of photoresist.

4. The process of claim 1, wherein said barrier layer is a refractory metal.

5. The process of claim 1, wherein said barrier layer is a refractory metal silicide.

6. The process of claim 1, wherein the disposable polymer layer is polyimide.

7. The process of claim 1, wherein the disposable polymer layer is a fluorocarbon polymer.

8. The process of claim 1, wherein the cell-isolation dielectric layer is silicon dioxide.

9. The process of claim 1, wherein the cell-isolation dielectric layer is silicon nitride.

10. The process of claim 1, wherein planarization of the cell-isolation dielectric layer is performed with a plasma etch back step following the blanket deposition of a planar layer of photoresist.

11. The process of claim 1, wherein the cell-isolation dielectric layer is planarized down to a level where the upper surface of each remnant of the disposable polymer layer is exposed, and the difference between the elevation of the upper surface of the cell-isolation dielectric layer and that of the upper surface of the barrier layer is substantially equal to the desired depth of the dielectric layer, and the upper surface of each remnant of disposable polymer layer is exposed.

12. The process of claim 11, wherein the ferroelectric dielectric layer is deposited via the solution-gelatin technique, to a depth that substantially fills each cavity formerly occupied by a disposable polymer layer remnant;

13. The process of claim 12, wherein the ferrelectric dielectric material is lead zirconate titanate (PZT).

14. The process of claim 1, wherein the cell-isolation dielectric layer is planarized down to a level that is substantially equal to the upper surface of the barrier layer.

15. The process of claim 14, wherein the ferroelectric dielectric layer is deposited via sputtering.

16. The process of claim 15, wherein the ferrelectric dielectric material is lead zirconate titanate (PZT).

17. A process for fabricating a capacitor having a ferroelectric dielectric layer superjacent the storage-node junction of each cell region within a dynamic random access memory array of stacked-cell design, said process commencing at a stage in the manufacturing process where storage-node contact regions are exposed by masking the array with a storage-node contact photomask and performing an etch to clear the substrate in those regions, and said process comprising the following sequence of steps:
   a) conformal deposition of an in-situ-doped storage-node polysilicon layer to a depth greater than that necessary to completely fill any inter-wordline and inter-bitline gaps;
   b) planarization of the storage-node poly layer to a level at which poly still covers the entire array;
   c) deposition of a conductive barrier layer on top of the planarized storage-node poly layer;
   d) deposition of a disposable polymer layer on top of the barrier layer;
   e) masking the disposable polymer layer with a photomask which patterns storage-node capacitor plates;
   f) anisotropically etching the disposable polymer layer, the barrier layer and the storage-node poly layer in a single step in order to create non-contiguous disposable layer, barrier layer, and storage-node poly layer remnants;
   g) blanket deposition of a cell-isolation dielectric layer at a temperature sufficiently low to prevent decomposition of the disposable polymer layer remnants, said cell-isolation layer being of sufficient depth to completely fill gaps between the disposable layer remnants;
   h) planarization of the cell-isolation dielectric layer to a level that exposes each disposable polymer layer remnant;
   i) removal of the disposable polymer layer remnants;
   j) deposition of a ferroelectric dielectric layer;
   k) annealing the ferroelectric dielectric layer; and
   l) deposition of a cell plate layer;

18. The process of claim 17, wherein planarization of said storage-node poly layer is performed via chemical-mechanical planarization (CMP).

19. The process of claim 17, wherein planarization of said storage-node poly layer is performed with a plasma etch back step following the blanket deposition of a planar layer of photoresist.

20. The process of claim 17, wherein said barrier layer is a refractory metal.

21. The process of claim 17, wherein said barrier layer is a refractory metal silicide.

22. The process of claim 17, wherein the disposable polymer layer is polyimide.

23. The process of claim 17, wherein the disposable polymer layer is a fluorocarbon polymer.

24. The process of claim 17, wherein the cell-isolation dielectric layer is silicon dioxide.

25. The process of claim 17, wherein the cell-isolation dielectric layer is silicon nitride.

26. The process of claim 17, wherein planarization of the cell-isolation dielectric layer is performed with a plasma etch back step following the blanket deposition of a planar layer of photoresist.

27. The process of claim 17, wherein the cell-isolation dielectric layer is planarized down to a level where the upper surface of each remnant of the disposable polymer layer is exposed, and the difference between the elevation of the upper surface of the cell-isolation dielectric layer and that of the upper surface of the barrier layer is substantially equal to the desired depth of the dielectric layer, and the upper surface of each remnant of disposable polymer layer is exposed.

28. The process of claim 27, wherein the ferroelectric dielectric layer is deposited via the solution-gelatin technique, to a depth that substantially fills each cavity formerly occupied by a disposable polymer layer remnant;

29. The process of claim 28, wherein the ferrelectric dielectric material is lead zirconate titanate (PZT).

30. The process of claim 17, wherein the cell-isolation dielectric layer is planarized down to a level that is substantially equal to the upper surface of the barrier layer.

31. The process of claim 30, wherein the ferroelectric dielectric layer is deposited via sputtering.

32. The process of claim 31, wherein the ferrelectric dielectric material is lead zirconate titanate (PZT).

* * * * *